(12) United States Patent
Kondiles et al.

(10) Patent No.: US 11,609,912 B2
(45) Date of Patent: *Mar. 21, 2023

(54) STORING DATA AND PARITY VIA A COMPUTING SYSTEM

(71) Applicant: Ocient Inc., Chicago, IL (US)

(72) Inventors: George Kondiles, Chicago, IL (US); Jason Arnold, Chicago, IL (US)

(73) Assignee: Ocient Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/679,835

(22) Filed: Feb. 24, 2022

(65) Prior Publication Data

US 2022/0179863 A1 Jun. 9, 2022

Related U.S. Application Data

(63) Continuation of application No. 17/091,195, filed on Nov. 6, 2020, now Pat. No. 11,294,902, which is a (Continued)

(51) Int. Cl.
*G06F 16/2453* (2019.01)
*G06F 16/22* (2019.01)
(Continued)

(52) U.S. Cl.
CPC ...... *G06F 16/24542* (2019.01); *G06F 3/0604* (2013.01); *G06F 3/068* (2013.01);
(Continued)

(58) Field of Classification Search
CPC .......... G06F 16/24553; G06F 16/2246; G06F 12/0893; G06F 3/067; G06F 9/5061; G06F 16/2282; G06F 16/1727; G06F 16/2453; G06F 16/9017; G06F 11/1044; G06F 16/244; G06F 3/068; G06F 9/5016;
(Continued)

(56) References Cited

U.S. PATENT DOCUMENTS 5,379,417 A 1/1995 Lui
5,548,770 A 8/1996 Bridges
(Continued)

OTHER PUBLICATIONS

A new high performance fabric for HPC, Michael Feldman, May 2016, Intersect360 Research.
(Continued)

*Primary Examiner* — Guy J Lamarre
(74) *Attorney, Agent, or Firm* — Garlick & Markison; Bruce E. Stuckman; Katherine C. Stuckman

(57) ABSTRACT

A method includes generating a plurality of parity blocks from a plurality of lines of data blocks. The plurality of lines of data blocks are stored in data sections of memory of a cluster of computing devices of the computing system by distributing storage of individual data blocks of the plurality of lines of data blocks among unique data sections of the cluster of computing devices. The plurality of parity blocks are stored in parity sections of memory of the cluster of computing devices by distributing storage of parity blocks of the plurality of parity blocks among unique parity sections of the cluster of computing devices.

20 Claims, 37 Drawing Sheets

Related U.S. Application Data continuation of application No. 16/267,676, filed on Feb. 5, 2019, now Pat. No. 10,866,954.

(60) Provisional application No. 62/745,787, filed on Oct. 15, 2018.

(51) Int. Cl.

| | | |
|---|---|---|
| *G06F 16/2455* | (2019.01) | |
| *G06F 16/901* | (2019.01) | |
| *G06F 9/4401* | (2018.01) | |
| *G06F 9/50* | (2006.01) | |
| *H04L 67/10* | (2022.01) | |
| *G06F 3/06* | (2006.01) | |
| *G06F 12/0893* | (2016.01) | |
| *G06F 16/17* | (2019.01) | |
| *G06F 11/10* | (2006.01) | |
| *G06F 12/109* | (2016.01) | |
| *G06F 16/23* | (2019.01) | |
| *G06F 16/242* | (2019.01) | |
| *H03M 7/30* | (2006.01) | |
| *G06F 16/2457* | (2019.01) | |
| *G06F 16/2458* | (2019.01) | |
| *G06F 16/27* | (2019.01) | |
| *G06F 7/24* | (2006.01) | |

(52) U.S. Cl.
CPC .............. *G06F 3/0647* (2013.01); *G06F 7/24* (2013.01); *G06F 9/4406* (2013.01); *G06F 9/5016* (2013.01); *G06F 9/5027* (2013.01); *G06F 9/5061* (2013.01); *G06F 11/1004* (2013.01); *G06F 11/1044* (2013.01); *G06F 11/1076* (2013.01); *G06F 12/0893* (2013.01); *G06F 12/109* (2013.01); *G06F 16/1727* (2019.01); *G06F 16/22* (2019.01); *G06F 16/2246* (2019.01); *G06F 16/2282* (2019.01); *G06F 16/2365* (2019.01); *G06F 16/244* (2019.01); *G06F 16/2445* (2019.01); *G06F 16/2453* (2019.01); *G06F 16/2458* (2019.01); *G06F 16/24553* (2019.01); *G06F 16/24573* (2019.01); *G06F 16/278* (2019.01); *G06F 16/901* (2019.01); *G06F 16/9017* (2019.01); *H03M 7/30* (2013.01); *H04L 67/10* (2013.01); *G06F 3/067* (2013.01); *G06F 16/24547* (2019.01); *G06F 2211/1011* (2013.01); *G06F 2212/608* (2013.01)

(58) Field of Classification Search
CPC .............. G06F 16/2365; G06F 12/109; G06F 16/2445; G06F 2211/1011; G06F 3/0647; G06F 16/2458; G06F 9/4406; G06F 16/22; G06F 16/24542; G06F 2212/608; G06F 16/901; G06F 11/1004; G06F 11/1076; G06F 7/24; G06F 9/5027; G06F 16/24573; G06F 3/0604; H03M 7/3064; H03M 7/30; H03M 7/6023; H04L 67/10
See application file for complete search history.

(56) References Cited

U.S. PATENT DOCUMENTS

| | | | |
|---|---|---|---|
| 6,230,200 B1 | 5/2001 | Forecast | |
| 6,633,772 B2 | 10/2003 | Ford | |
| 7,499,907 B2 | 3/2009 | Brown | |
| 7,908,242 B1 | 3/2011 | Achanta | |
| 10,866,954 B2* | 12/2020 | Kondiles | G06F 9/5027 |
| 11,294,902 B2* | 4/2022 | Kondiles | G06F 16/2458 |
| 2001/0051949 A1 | 12/2001 | Carey | |
| 2002/0032676 A1 | 3/2002 | Reiner | |
| 2004/0162853 A1 | 8/2004 | Brodersen | |
| 2007/0094269 A1 | 4/2007 | Mikesell | |
| 2008/0133456 A1 | 6/2008 | Richards | |
| 2009/0063501 A1 | 3/2009 | Buckler | |
| 2009/0063893 A1 | 3/2009 | Bagepalli | |
| 2009/0183167 A1 | 7/2009 | Kupferschmidt | |
| 2010/0082577 A1 | 4/2010 | Mirchandani | |
| 2010/0241646 A1 | 9/2010 | Friedman | |
| 2010/0274983 A1 | 10/2010 | Murphy | |
| 2010/0312756 A1 | 12/2010 | Zhang | |
| 2011/0219169 A1 | 9/2011 | Zhang | |
| 2012/0109888 A1 | 5/2012 | Zhang | |
| 2012/0151118 A1 | 6/2012 | Flynn | |
| 2012/0185866 A1 | 7/2012 | Couvee | |
| 2012/0192037 A1 | 7/2012 | Gibson | |
| 2012/0254252 A1 | 10/2012 | Jin | |
| 2012/0311246 A1 | 12/2012 | McWilliams | |
| 2013/0304964 A1 | 11/2013 | Chu | |
| 2013/0332484 A1 | 12/2013 | Gajic | |
| 2014/0047095 A1 | 2/2014 | Breternitz | |
| 2014/0136510 A1 | 5/2014 | Parkkinen | |
| 2014/0188841 A1 | 7/2014 | Sun | |
| 2014/0331020 A1 | 11/2014 | Hendry | |
| 2015/0100860 A1 | 4/2015 | Lee | |
| 2015/0205607 A1 | 7/2015 | Lindholm | |
| 2015/0244804 A1 | 8/2015 | Warfield | |
| 2015/0248366 A1 | 9/2015 | Bergsten | |
| 2015/0293966 A1 | 10/2015 | Cai | |
| 2015/0310045 A1 | 10/2015 | Konik | |
| 2016/0034547 A1 | 2/2016 | Lerios | |
| 2016/0259687 A1 | 9/2016 | Yoshihara | |
| 2017/0010833 A1 | 1/2017 | Lu | |
| 2017/0147265 A1 | 5/2017 | Kingdon | |
| 2017/0270179 A1 | 9/2017 | Jiang | |

OTHER PUBLICATIONS

Alechina, N. (2006-2007). B-Trees School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. . com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; dated Feb. 13, 2018; 17 pgs.

International Searching Authority; International Search Report and Written Opinion; International Application No. PCT/US2017/054784; dated Dec. 28, 2017; 10 pgs.

International Searching Authority; International Search Report and Written Opinion; International Application No. PCT/US2017/066145; dated Mar. 5, 2018; 13 pgs.

International Searching Authority; International Search Report and Written Opinion; International Application No. PCT/US2017/066169; dated Mar. 6, 2018; 15 pgs.

International Searching Authority; International Search Report and Written Opinion; International Application No. PCT/US2018/025729; dated Jun. 27, 2018; 9 pgs.

International Searching Authority; International Search Report and Written Opinion; International Application No. PCT/US2018/034859; dated Oct. 30, 2018; 8 pgs.

MapReduce: Simplified Data Processing on Large Clusters, OSDI 2004, Jeffrey Dean and Sanjay Ghemawat, Google, Inc., 13 pgs.

Rodero-Merino, L.; Storage of Structured Data: Big Table and HBase, New Trends In Distributed Systems, MSc Software and Systems, Distributed Systems Laboratory; Oct. 17, 2012; 24 pages.

(56) References Cited

OTHER PUBLICATIONS

Step 2: Examine the data model and implementation details, 2016, Amazon Web Services, Inc., http://docs.aws.amazon.com/amazondynamodb/latestldeveloperguide!Ti . . . .

* cited by examiner

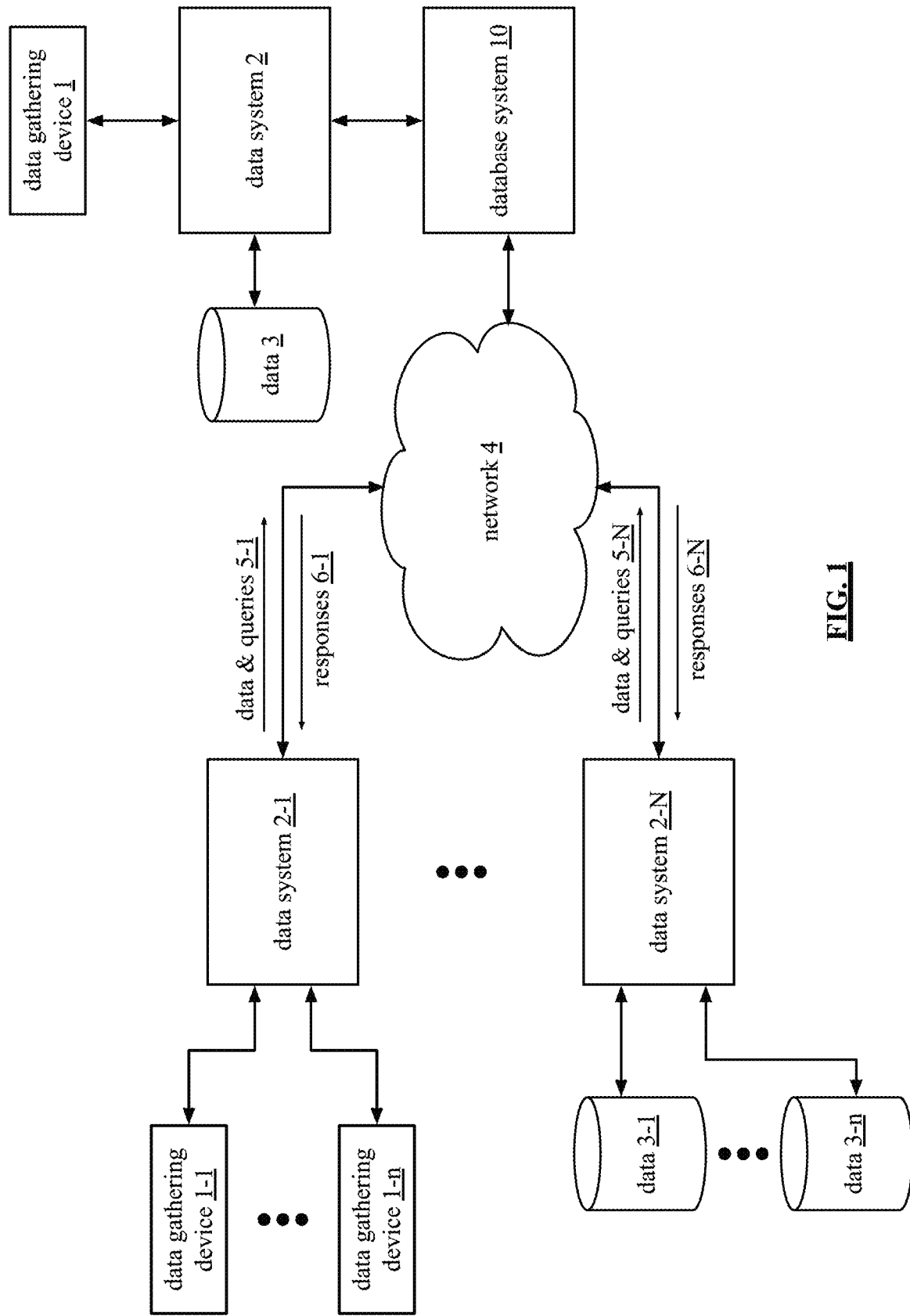

database system 10 computing device 18 computing device 18 computing device 18 node 37 node 37 node 37 node 37

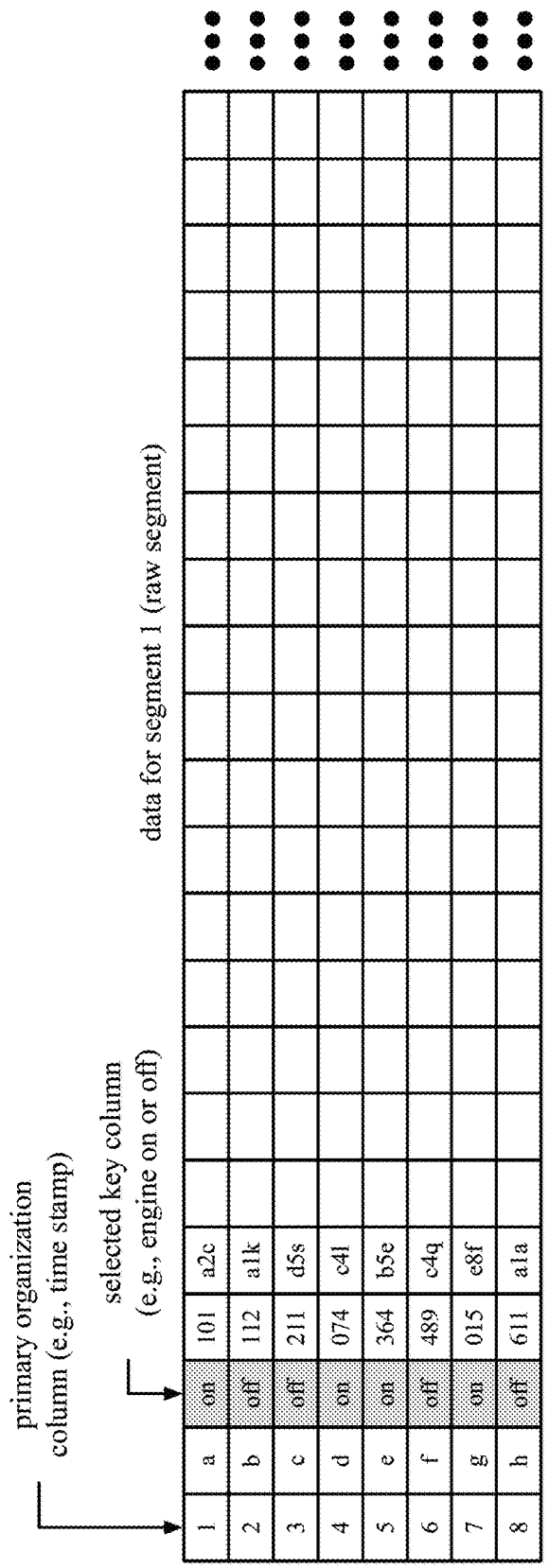

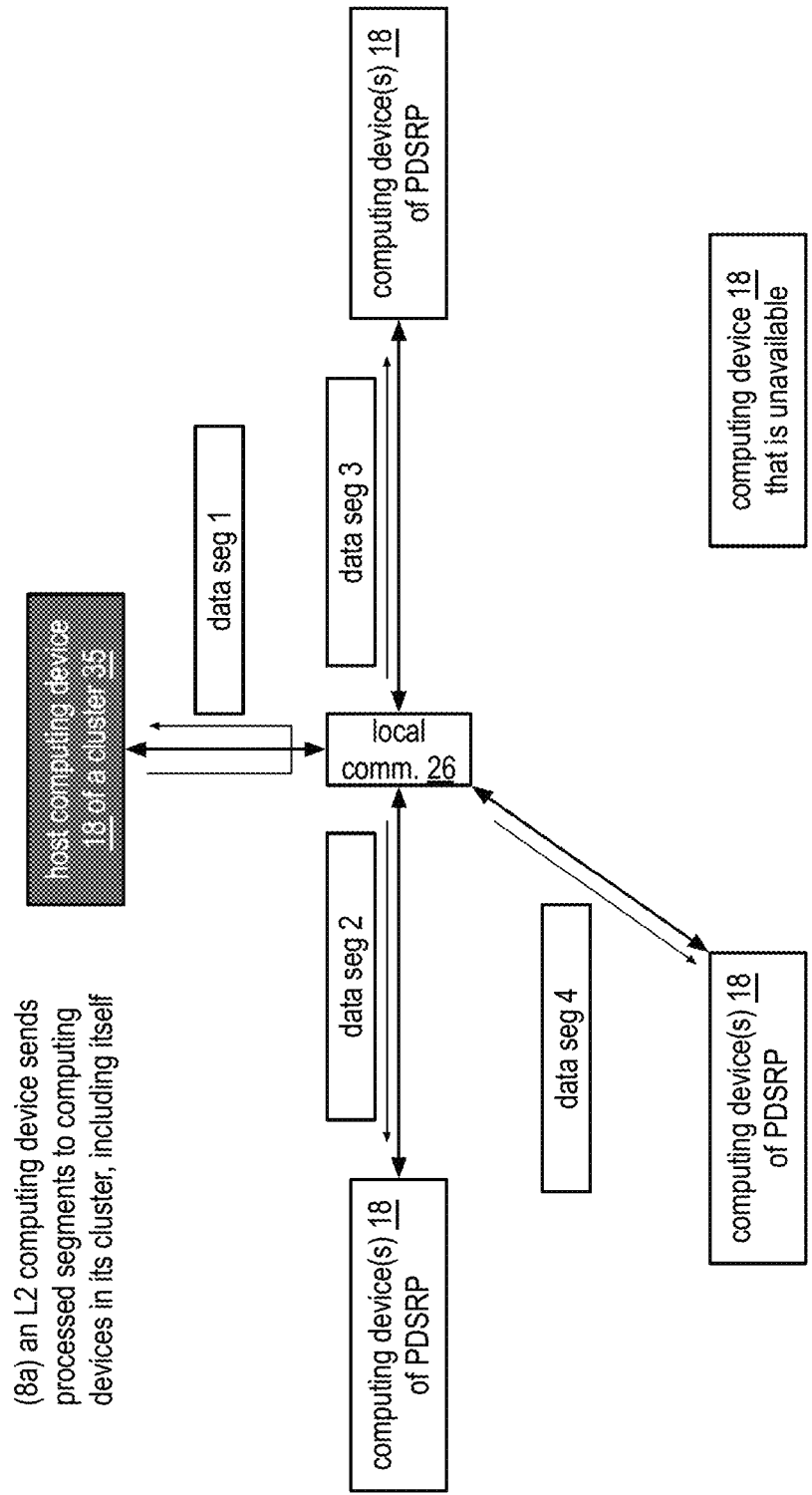

STORING DATA AND PARITY VIA A COMPUTING SYSTEM

CROSS-REFERENCE TO RELATED APPLICATIONS

The present U.S. Utility patent application claims priority pursuant to 35 U.S.C. § 120 as a continuation of U.S. Utility application Ser. No. 17/091,195, entitled "STORING DATA AND PARITY IN COMPUTING DEVICES", filed Nov. 6, 2020, which is a continuation of U.S. Utility application Ser. No. 16/267,676, entitled "STORING DATA IN A DATA SECTION AND PARITY IN A PARITY SECTION OF COMPUTING DEVICES", filed Feb. 5, 2019, issued as U.S. Pat. No. 10,866,954 on Dec. 15, 2020, which claims priority pursuant to 35 U.S.C. § 119(e) to U.S. Provisional Application No. 62/745,787, entitled "DATABASE SYSTEM AND OPERATION," filed Oct. 15, 2018, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIG. 1 is a schematic block diagram of an embodiment of a large scale data processing network that includes a database system in accordance with the present invention;

FIGS. 15-25 are schematic block diagrams of an example of processing a table or data set for storage in the database system in accordance with the present invention;

FIG. 29 is a schematic block diagram of an example of encoding a code line of data in accordance with the present invention;

Figure 37:
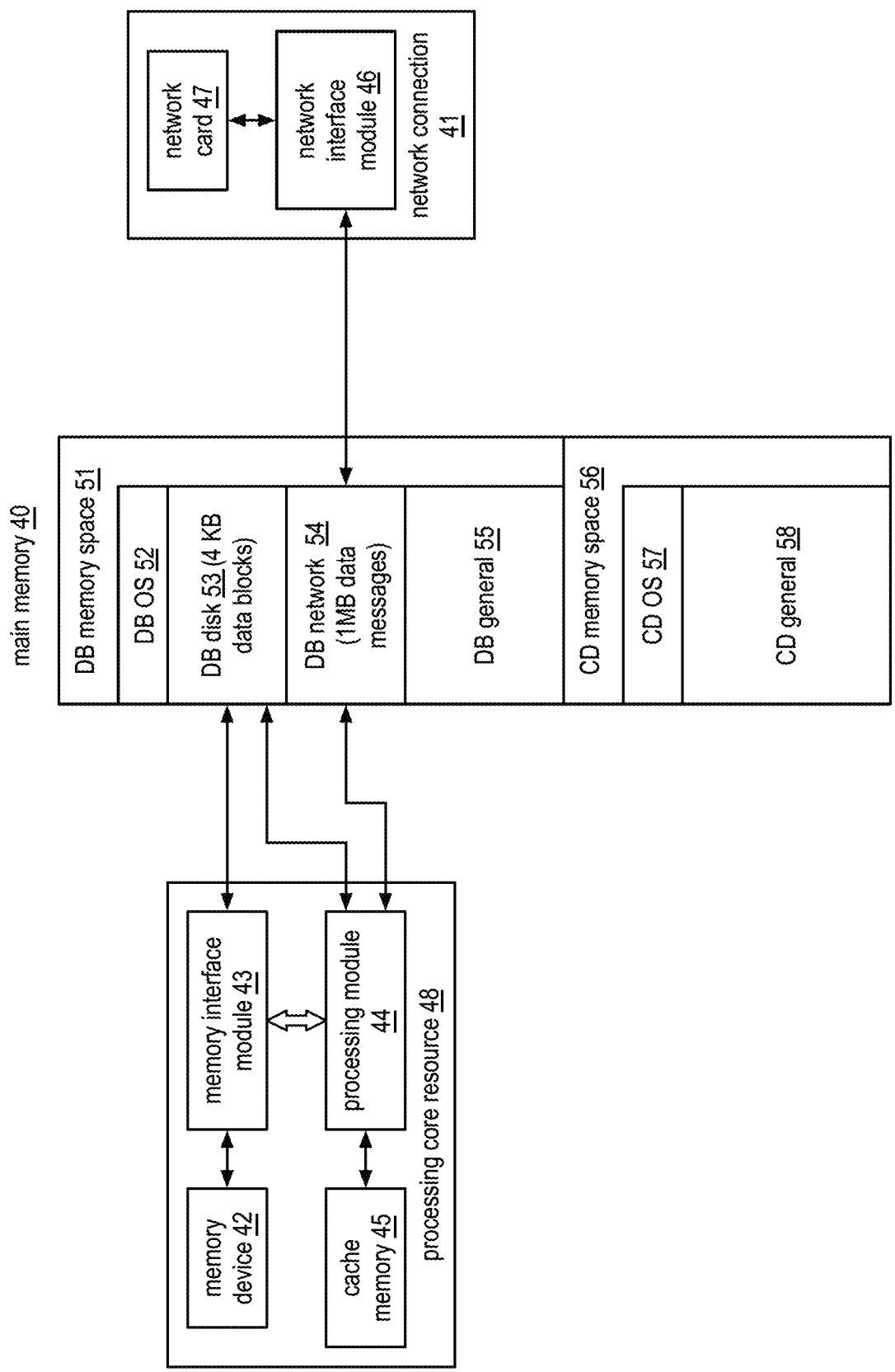
Figure 38:
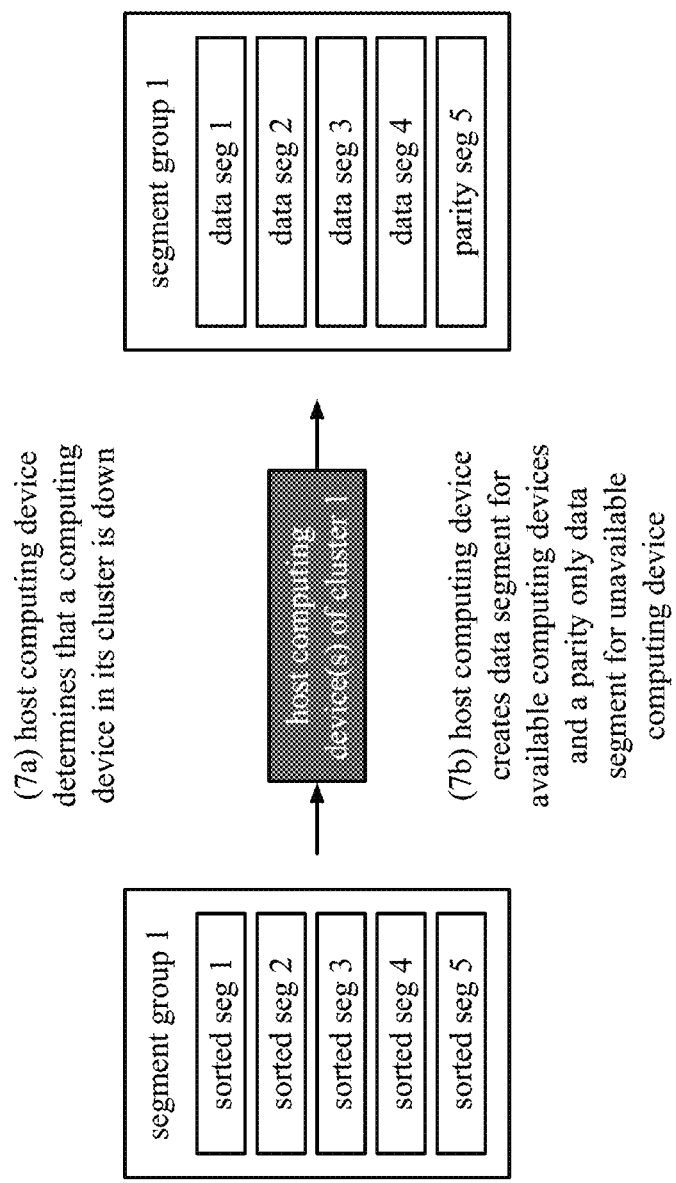

FIG. 37 is a schematic block diagram of an example of direct memory access for a processing core resource and/or for a network connection in accordance with the present invention; and FIGS. 38-39 are schematic block diagrams of an example of processing received data and distributing the processed data for storage in the database system when a computing device in a storage cluster is unavailable in accordance with the present invention.

DETAILED DESCRIPTION OF THE INVENTION

FIG. 1 is a schematic block diagram of an embodiment of a large-scale data processing network that includes data gathering device 1, data gathering devices 1-1 through 1-n, data system 2, data systems 2-1 through 2-N, data 3, data 3-1 through 3-n, a network 4, and a database system 10. The data systems 2-1 through 2-N provide, via the network 4, data and queries 5-1 through 5-N data to the database system 10. Alternatively, or in addition to, the data system 2 provides further data and queries directly to the database system 10. In response to the data and queries, the database system 10 issues, via the network 4, responses 6-1 through 6-N to the data systems 2-1 through 2-N. Alternatively, or in addition to, the database system 10 provides further responses directly to the data system 2. The data gathering devices 1, 1-1 through 1-n may be implemented utilizing sensors, monitors, handheld computing devices, etc. and/or a plurality of storage devices including hard drives, cloud storage, etc. The data gathering devices 1-1 through 1-n may provide real-time data to the data system 2-1 and/or any other data system and the data 3-1 through 3-n may provide stored data to the data system 2-N and/or any other data system.

Figure 1A:
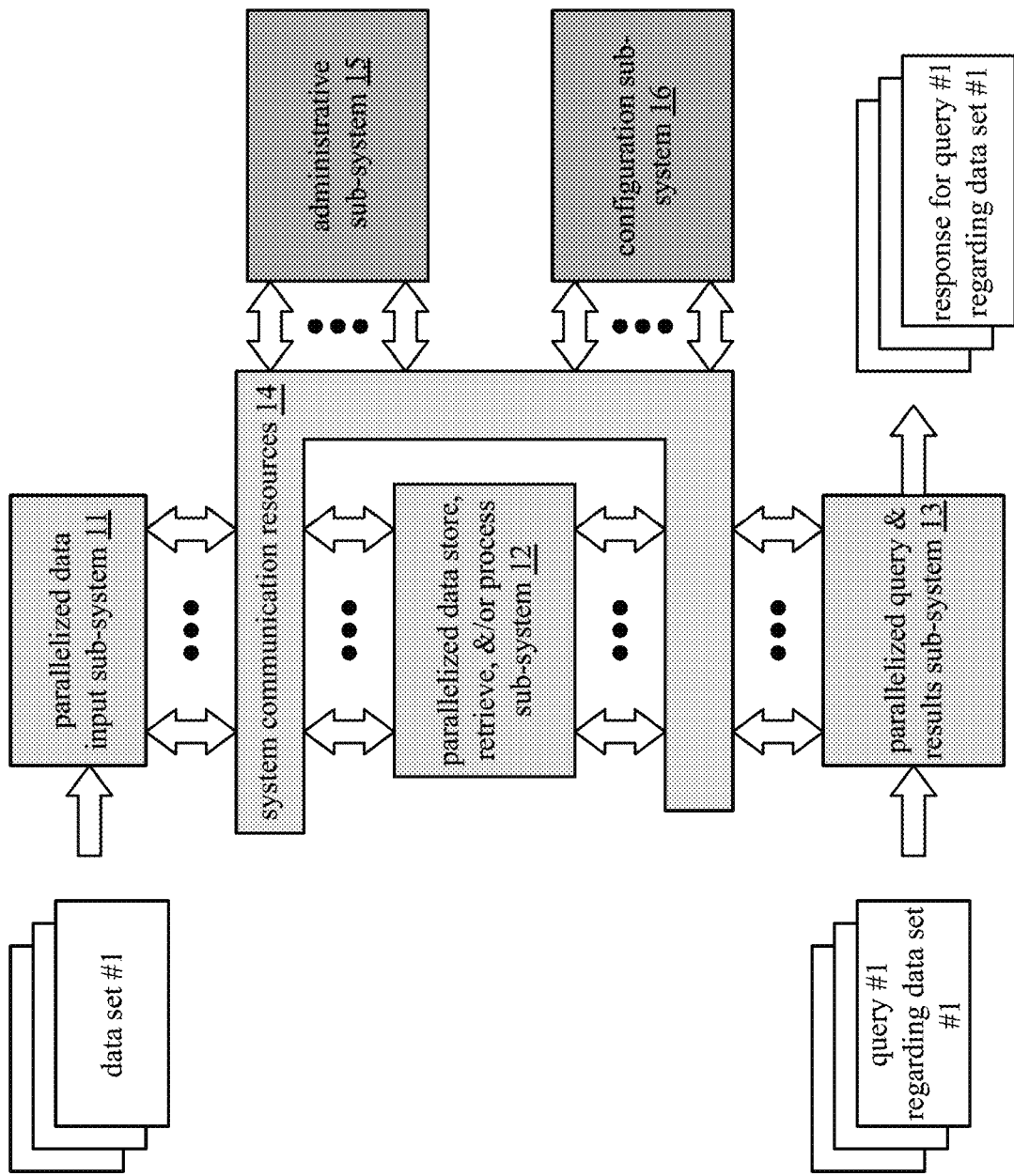
FIG. 1A is a schematic block diagram of an embodiment of a database system in accordance with the present invention.

FIG. 1A is a schematic block diagram of an embodiment of a database system 10 that includes data processing and system administration. The data processing includes a parallelized data input sub-system 11, a parallelized data store, retrieve, and/or process sub-system 12, a parallelized query and response sub-system 13, and system communication resources 14. The system administration includes an administrative sub-system 15 and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together. Each of the sub-systems 11, 12, 13, 15, and 16 include a plurality of computing devices; an example of which is discussed with reference to one or more of FIGS. 7-9.

In an example of operation, the parallelized data input sub-system 11 receives tables of data from a data source. For example, a data set no. 1 is received when the data source includes one or more computers. As another example, the data source is a plurality of machines. As yet another example, the data source is a plurality of data mining algorithms operating on one or more computers. The data source organizes its data into a table that includes rows and columns. The columns represent fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data into a plurality of data partitions. For each data partition, the parallelized data input sub-system 11 determines a number of data segments based on a desired encoding scheme. As a specific example, when a 4 of 5 encoding scheme is used (meaning any 4 of 5 encoded data elements can be used to recover the data), the parallelized data input sub-system 11 divides a data partition into 5 segments. The parallelized data input sub-system 11 then divides a data segment into data slabs. Using one or more of the columns as a key, or keys, the parallelized data input sub-system 11 sorts the data slabs. The sorted data slabs are sent, via the system communication resources 14, to the parallelized data store, retrieve, and/or process sub-system 12 for storage.

The parallelized query and response sub-system 13 receives queries regarding tables and processes the queries prior to sending them to the parallelized data store, retrieve, and/or process sub-system 12 for processing. For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the sub-system 13 for subsequent processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, sub-query or not, and so on.

The assigned node then creates an initial query plan from the annotated abstract syntax tree. The assigned node optimizes the initial query plan using a cost analysis function (e.g., processing time, processing resources, etc.). Once the query plan is optimized, it is sent, via the system communication resources 14, to the parallelized data store, retrieve, and/or process sub-system 12 for processing.

Within the parallelized data store, retrieve, and/or process sub-system 12, a computing device is designated as a primary device for the query plan and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan. The primary device provides the resulting response to the assigned node of the parallelized query and response sub-system 13. The assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query.

Figure 2:
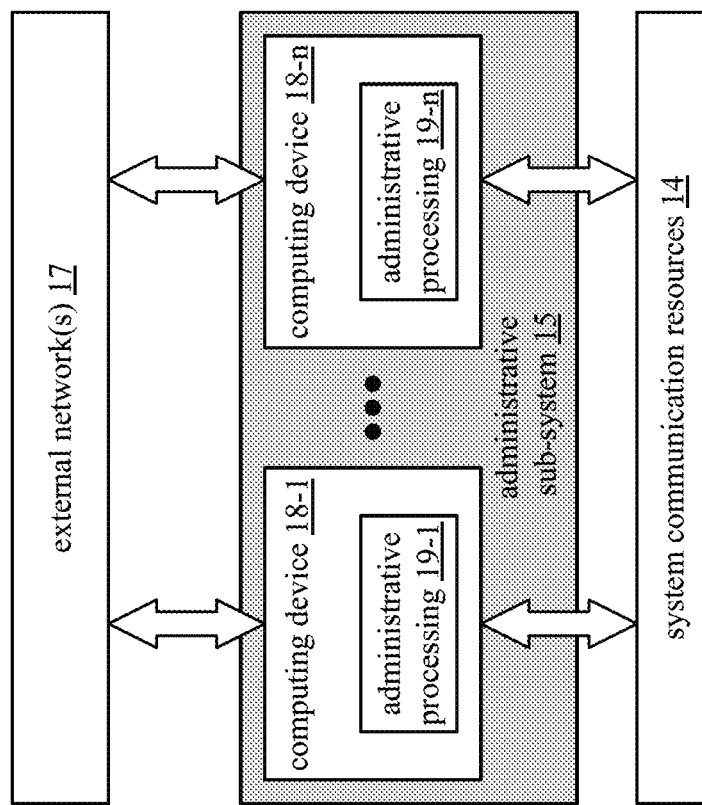
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

Figure 3:
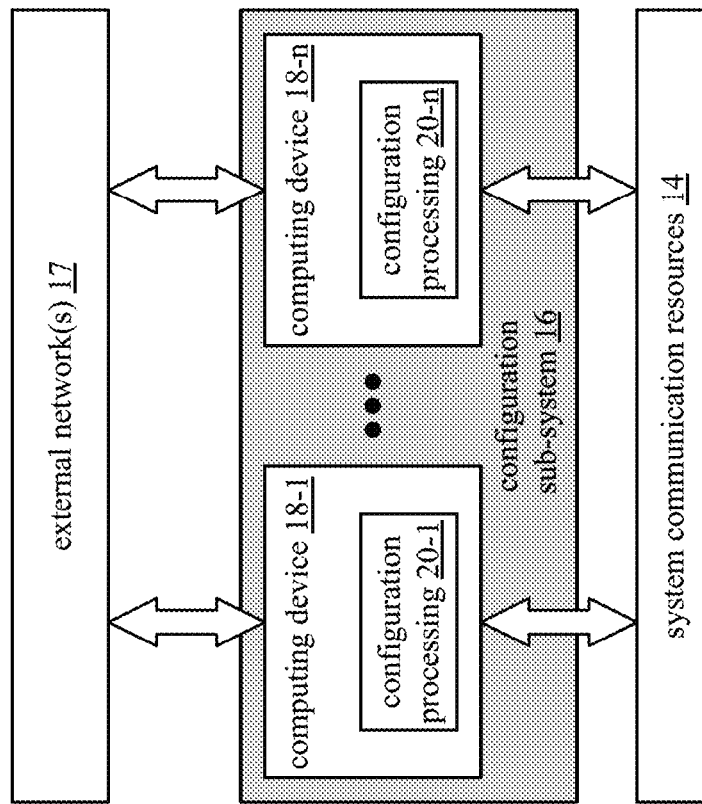
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function utilizing a corresponding configuration processing of configuration processing 20-1 through 20-n (which includes a plurality of configuration operations) that coordinates system level configurations of the database system. Each computing device is coupled to the external network 17 of FIG. 2, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of a configuration operation independently. This supports lock free and parallel execution of one or more configuration operations.

Figure 4:
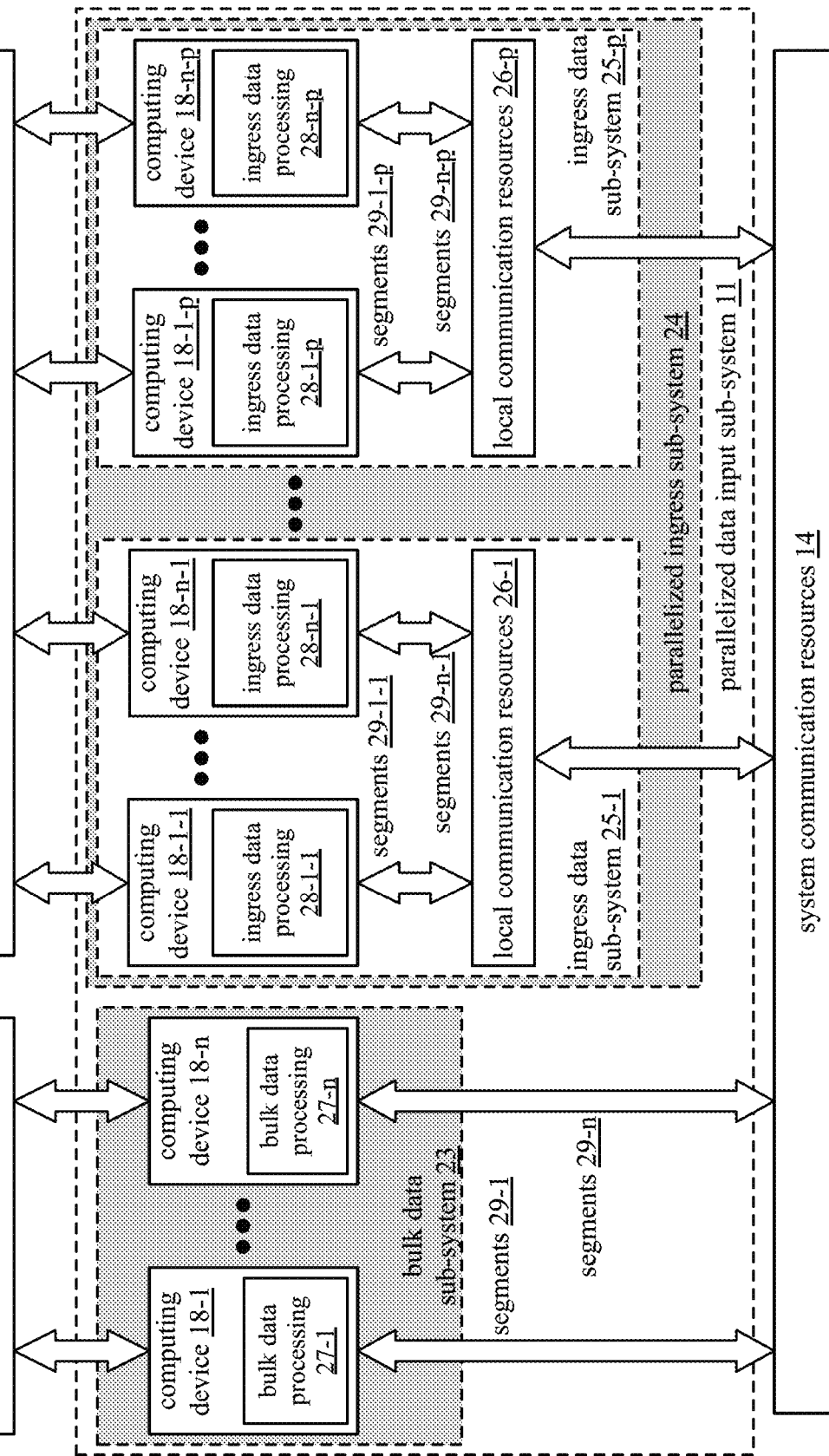
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. The computing devices of the bulk data sub-system 23 execute a bulk data processing function to retrieve a table from a network storage system 21 (e.g., a server, a cloud storage service, etc.).

The parallelized ingress sub-system 24 includes a plurality of ingress data sub-systems 25-1 through 25-p that each include a local communication resource of local communication resources 26-1 through 26-p and a plurality of computing devices 18-1 through 18-n. Each of the computing devices of the parallelized ingress sub-system 24 execute an ingress data processing function utilizing an ingress data processing of ingress data processing 28-1 through 28-n of each ingress data sub-system 25-1 through 25-p that enables the computing device to stream data of a table (e.g., a data set 30-2 as segments 29-1-1 through 29-1-n and through 29-1-p through 29-n-p) into the database system 10 of FIG. 1A via a wide area network 22 (e.g., cellular network, Internet, telephone network, etc.). The streaming may further be via corresponding local communication resources 26-1 through 26-p and via the system communication resources 14 of FIG. 1A. With the plurality of ingress data sub-systems 25-1 through 25-p, data from a plurality of tables can be streamed into the database system 10 at one time (e.g., simultaneously utilizing two or more of the ingress data sub-systems 25-1 through 25-p in a parallel fashion).

Each of the bulk data processing function and the ingress data processing function generally function as described with reference to FIG. 1 for processing a table for storage. The bulk data processing function is geared towards retrieving data of a table in a bulk fashion (e.g., a data set 30-1 as the table is stored and retrieved, via the system communication resources 14 of FIG. 1A, from storage as segments 29-1 through 29-n). The ingress data processing function, however, is geared towards receiving streaming data from one or more data sources. For example, the ingress data processing function is geared towards receiving data from a plurality of machines in a factory in a periodic or continual manner as the machines create the data.

As will be described in greater detail with reference to one or more subsequent figures, a computing device includes a plurality of nodes and each node includes a plurality of processing core resources. Each processing core resource is capable of executing at least a portion of the bulk data processing function or the ingress data processing function. In an embodiment, a plurality of processing core resources of one or more nodes executes the bulk data processing function or the ingress data processing function to produce the storage format for the data of a table.

Figure 5:
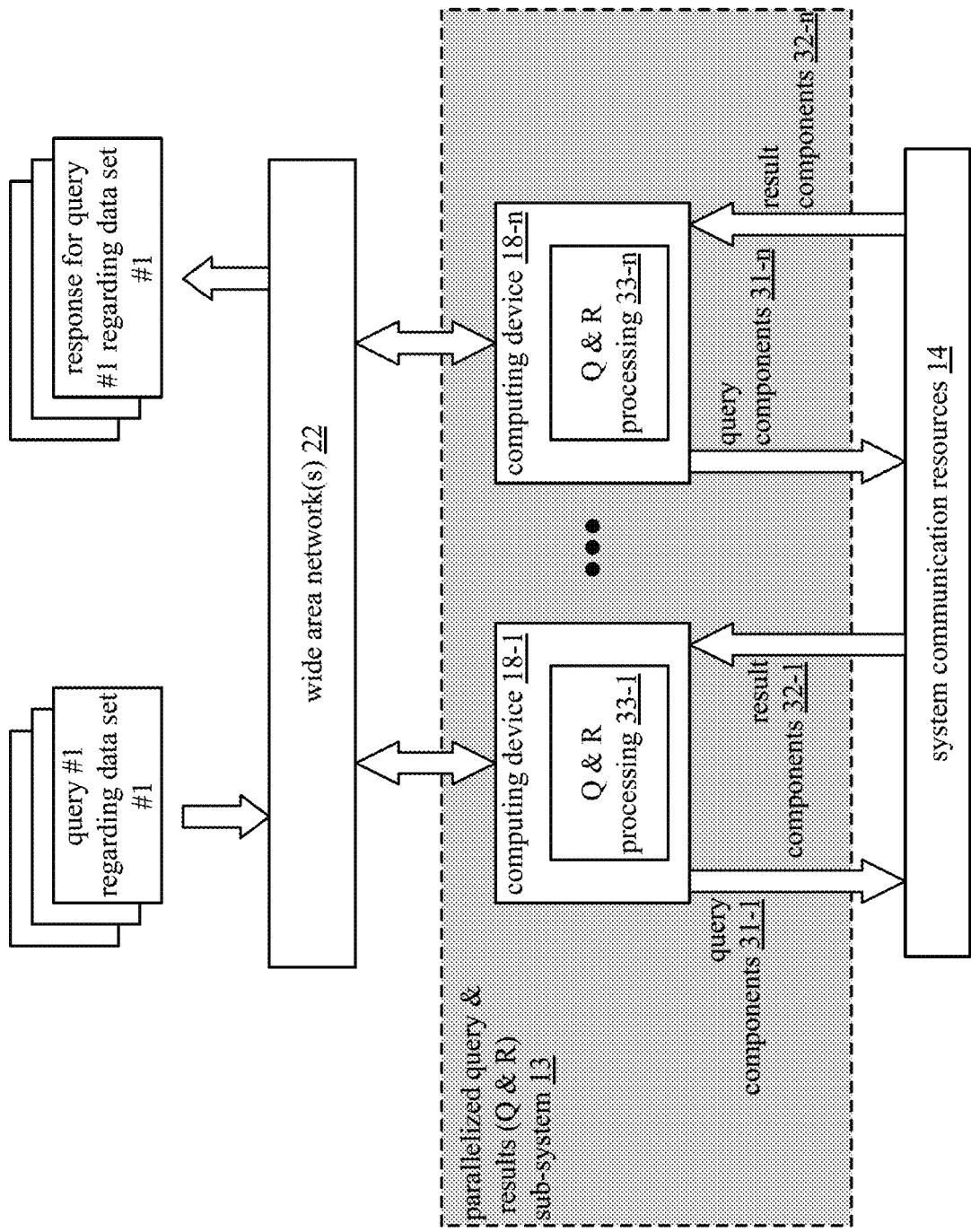
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-n. Each of the computing devices executes a query (Q) & response (R) function utilizing a corresponding Q & R processing of Q & R processing 33-1 through 33-n. The computing devices are coupled to the wide area network 22 of FIG. 4 to receive queries (e.g., query no. 1 regarding data set no. 1) regarding tables and to provide responses to the queries (e.g., response for query no. 1 regarding the data set no. 1). For example, the plurality of computing devices 18-1 through 18-n receives a query, via the wide area network 22, issues, via the system communication resources 14 of FIG. 1A, query components 31-1 through 31-n to the parallelized data store, retrieve, &/or process sub-system 12 of FIG. 1A, receives, via the system communication resources 14, results components 32-1 through 32-n, and issues, via the wide area network 22, a response to the query.

The Q & R function enables the computing devices to processing queries and create responses as discussed with reference to FIG. 1. As will be described in greater detail with reference to one or more subsequent figures, a computing device includes a plurality of nodes and each node includes a plurality of processing core resources. Each processing core resource is capable of executing at least a portion of the Q & R function. In an embodiment, a plurality of processing core resources of one or more nodes executes the Q & R function to produce a response to a query.

Figure 6:
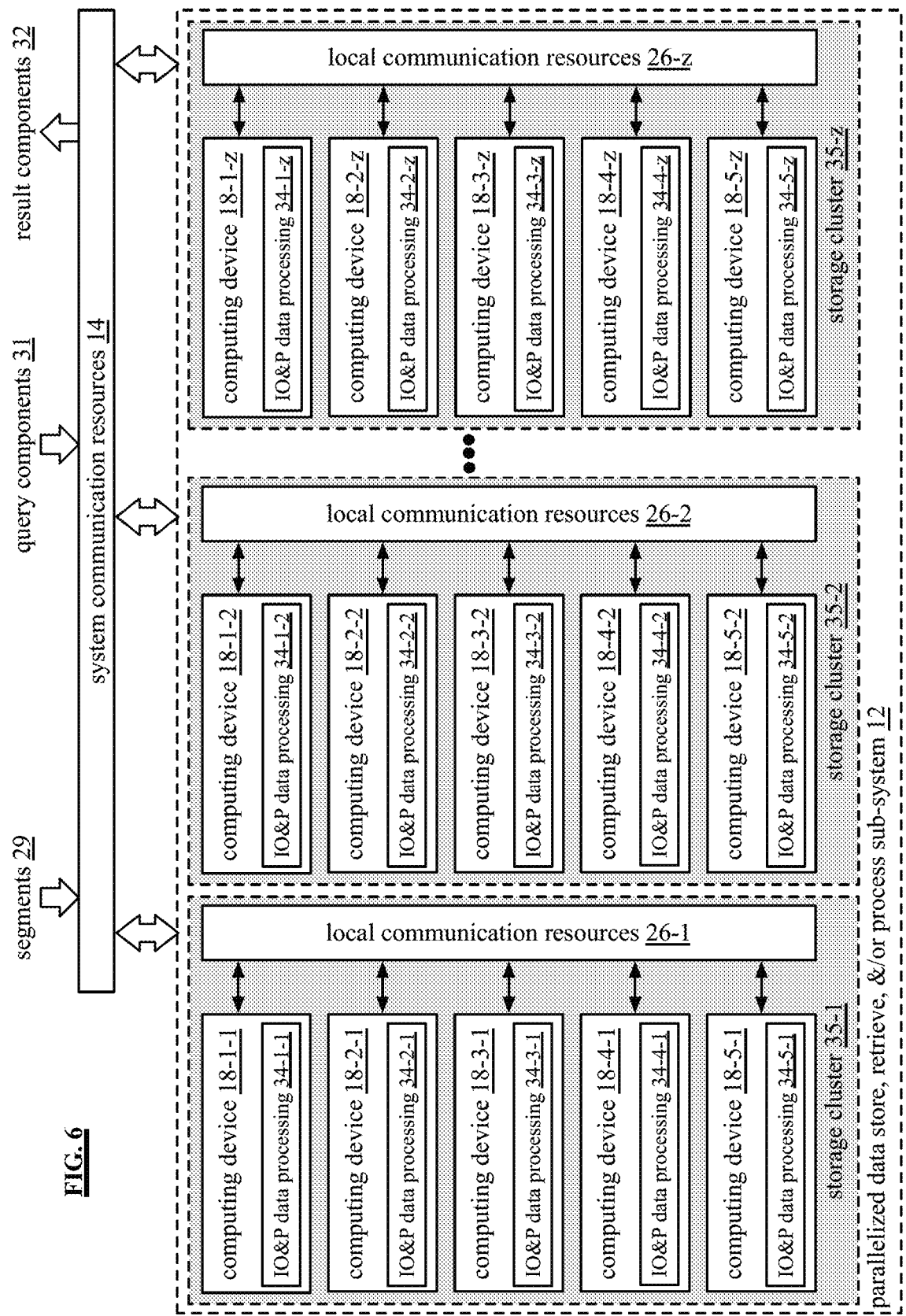
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of storage clusters 35-1 through 35-z. Each storage cluster includes a corresponding local communication resource of a plurality of local communication resources 26-1 through 26-z and includes a plurality of computing devices 18-1 through 18-5 and each computing device executes an input, output, and processing (TO &P) function utilizing a corresponding TO &P function of TO &P functions 34-1 through 34-5 to produce at least a portion of a resulting response. Each local communication resource may be implemented with a local communication resource of the local communication resources 26-1 through 26p of FIG. 4. The number of computing devices in a cluster corresponds to the number of segments in which a data partitioned is divided. For example, if a data partition is divided into five segments, a storage cluster includes five computing devices. Each computing device then stores one of the segments. As an example of operation, segments 29 are received, via the system communication resources 14 of FIG. 1A and via the local communication resources 26-1, for storage by computing device 18-4-1. Subsequent to storage, query components 31 (e.g., a query) are received, via the system communication resources 14 and the local communication resources 26-1, by the computing device 18-4-1 for processing by the IO & P data processing 34-4-1 to produce result components 32 (e.g., query response). The computing device 18-4-1 facilitates sending, via the local communication resources 26-1 and the system communication resources 14, the result components 32 to a result receiving entity.

As will be described in greater detail with reference to one or more subsequent figures, a computing device includes a plurality of nodes and each node includes a plurality of processing core resources. Each processing core resource is capable of executing at least a portion of the IO & P function. In an embodiment, a plurality of processing core resources of one or more nodes executes the IO & P function to produce at least a portion of the resulting response as discussed in FIG. 1.

Figure 7:
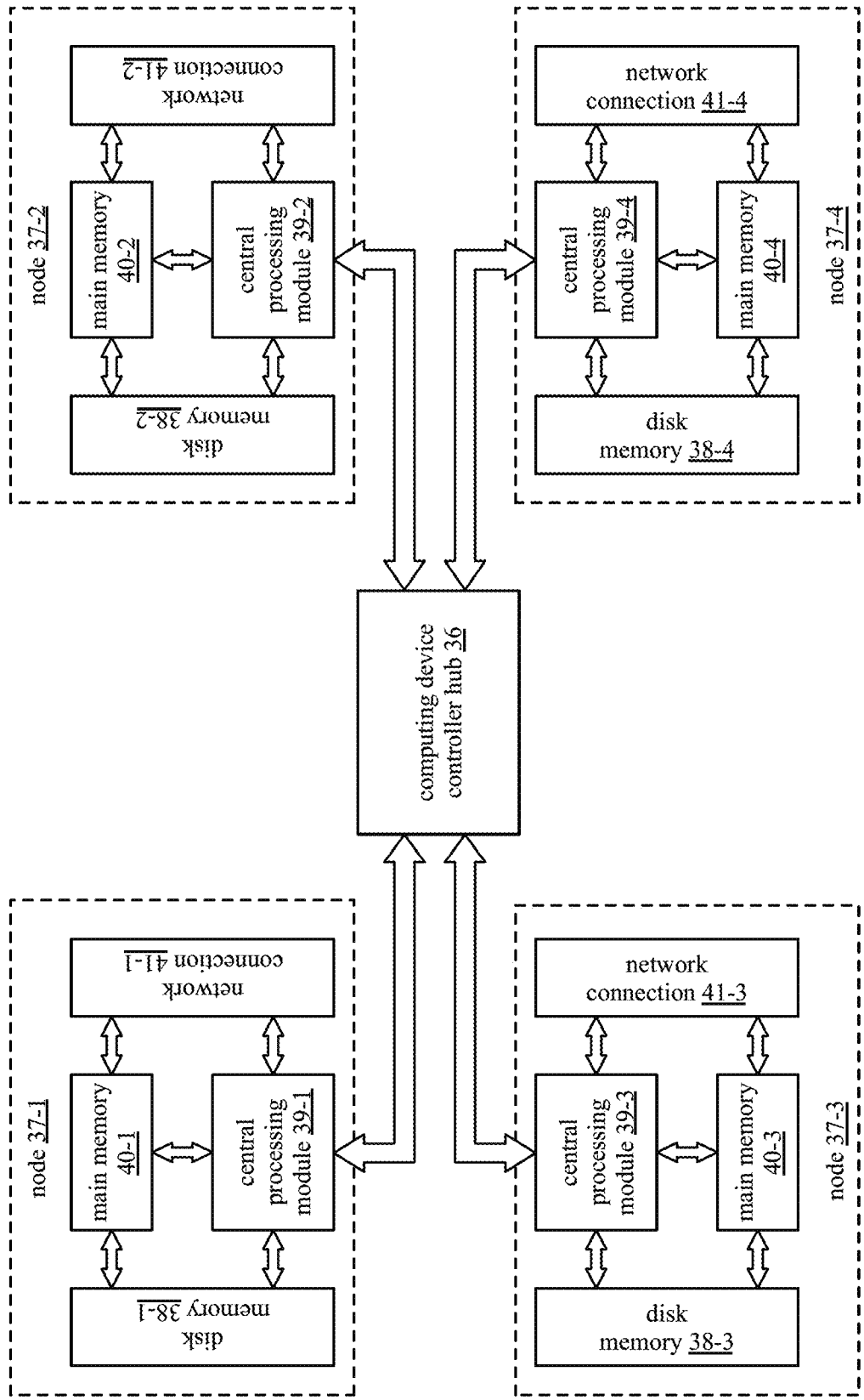
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module of central processing modules 40-1 through 40-4, a main memory of main memories 39-1 through 39-4, a disk memory of disk memories 38-1 through 38-4, and a network connection of network connections 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
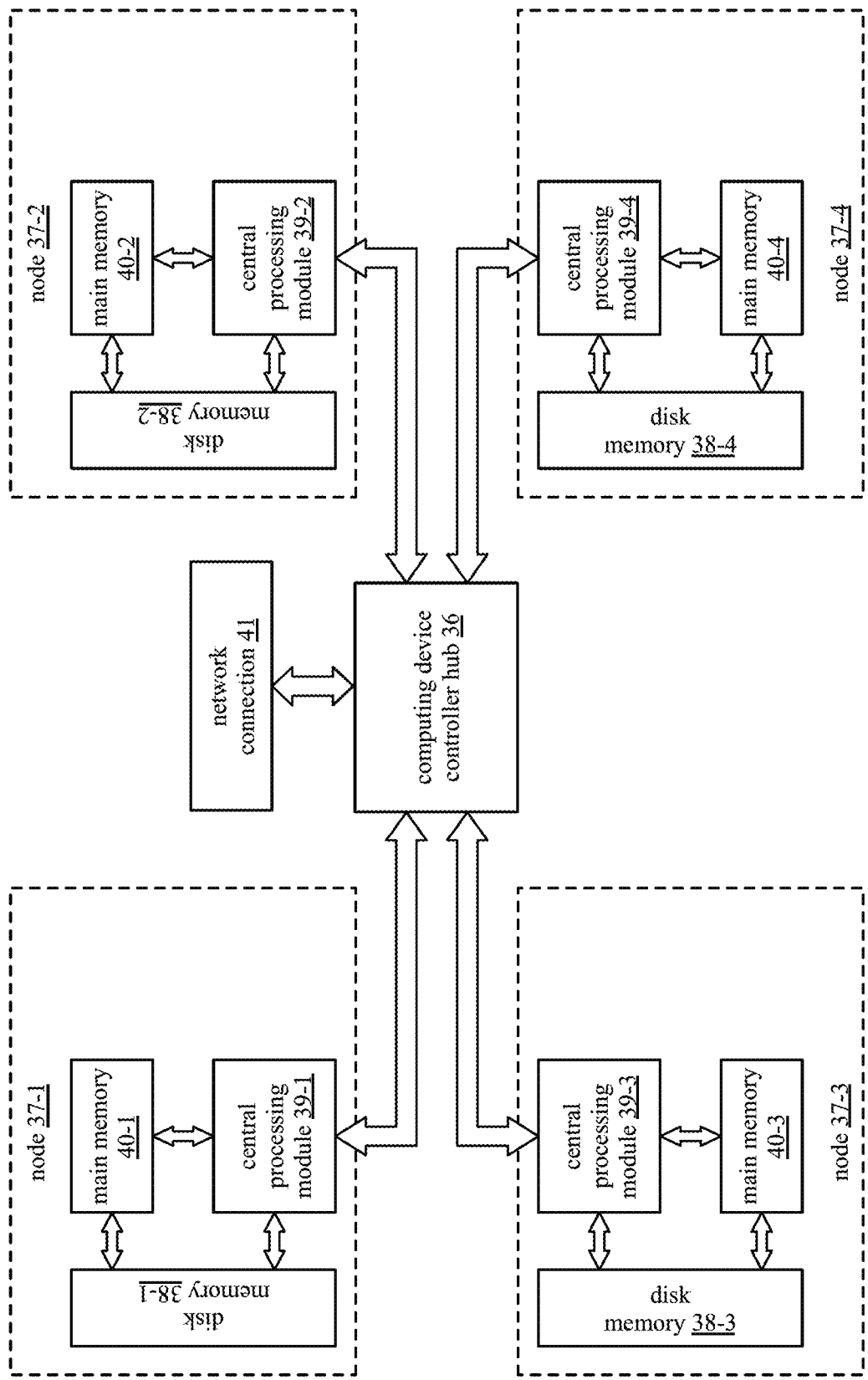
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
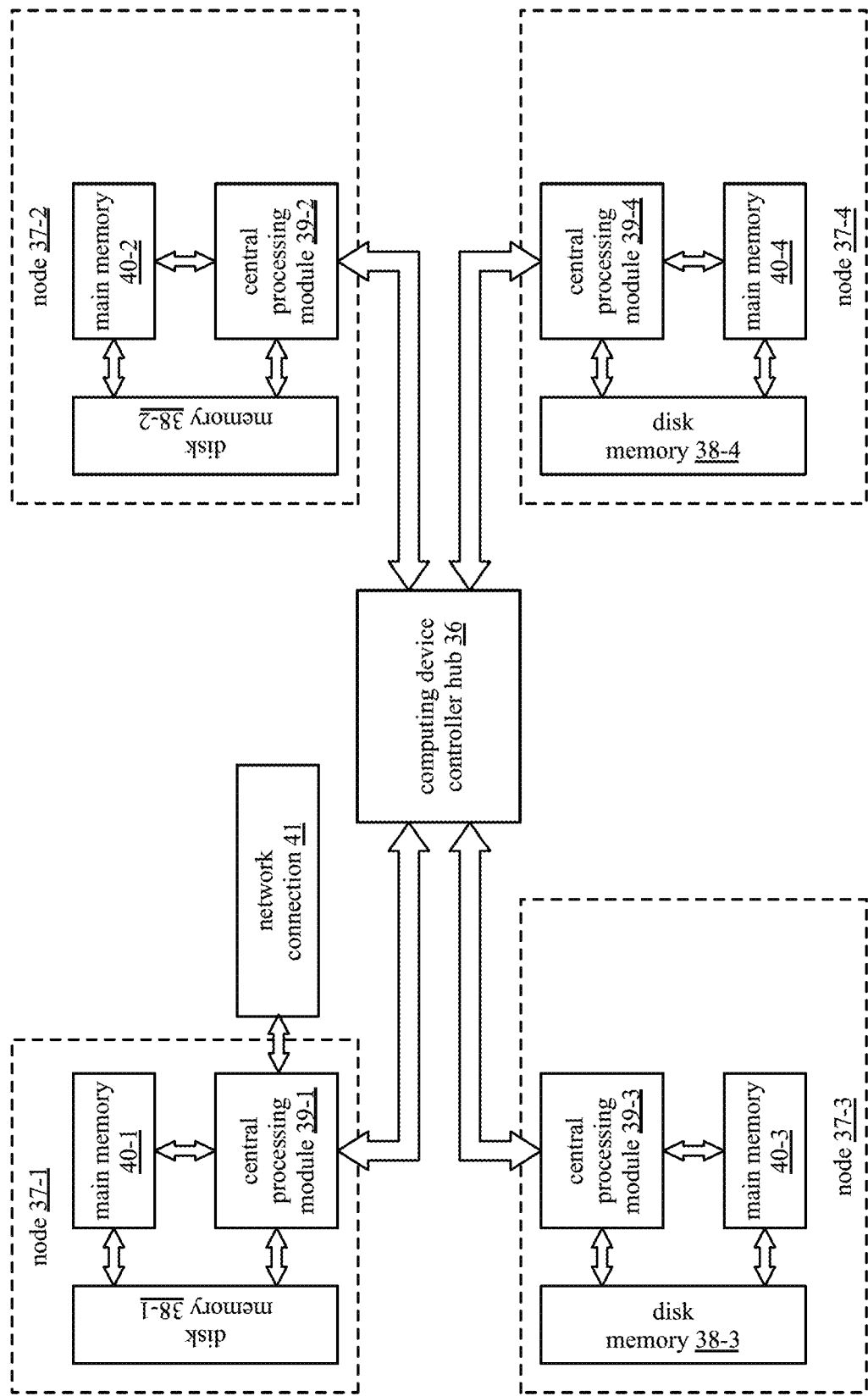
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 40-1 of node 37-1). As such, each node coordinates with the central processing module via the computing device controller hub 36 to transmit or receive data via the network connection.

Figure 10:
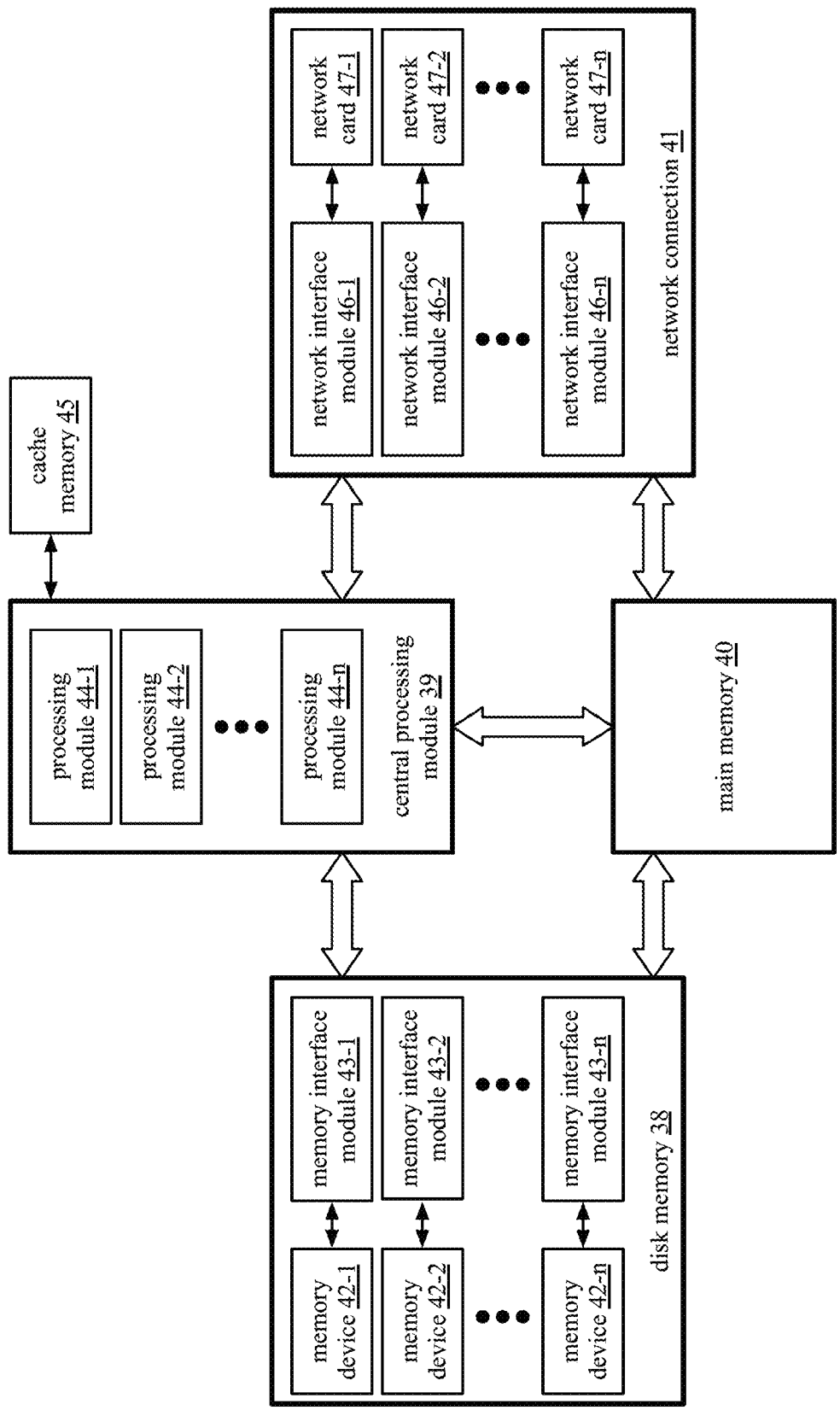
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n. The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
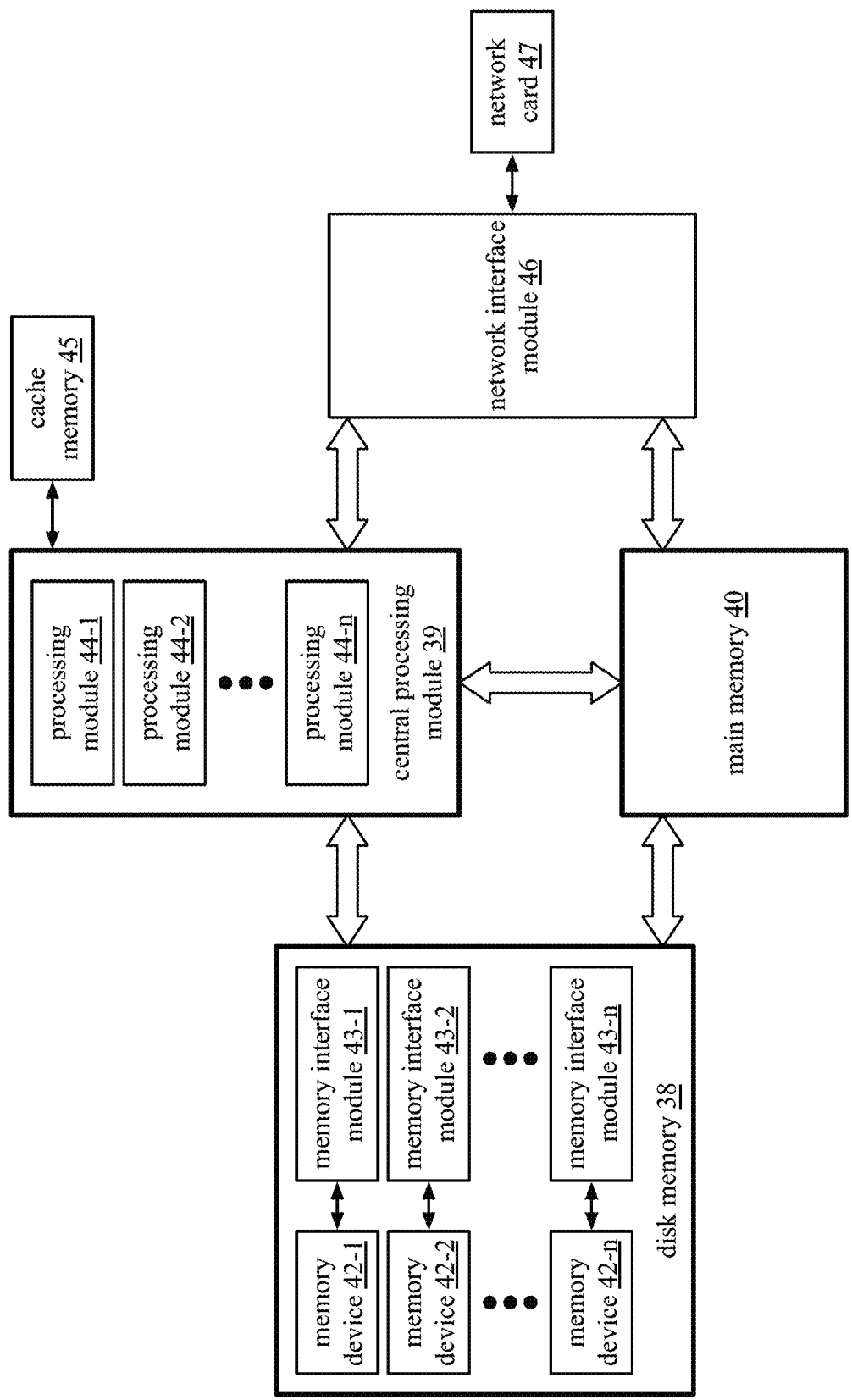
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and a corresponding network card 47 configuration.

Figure 12:
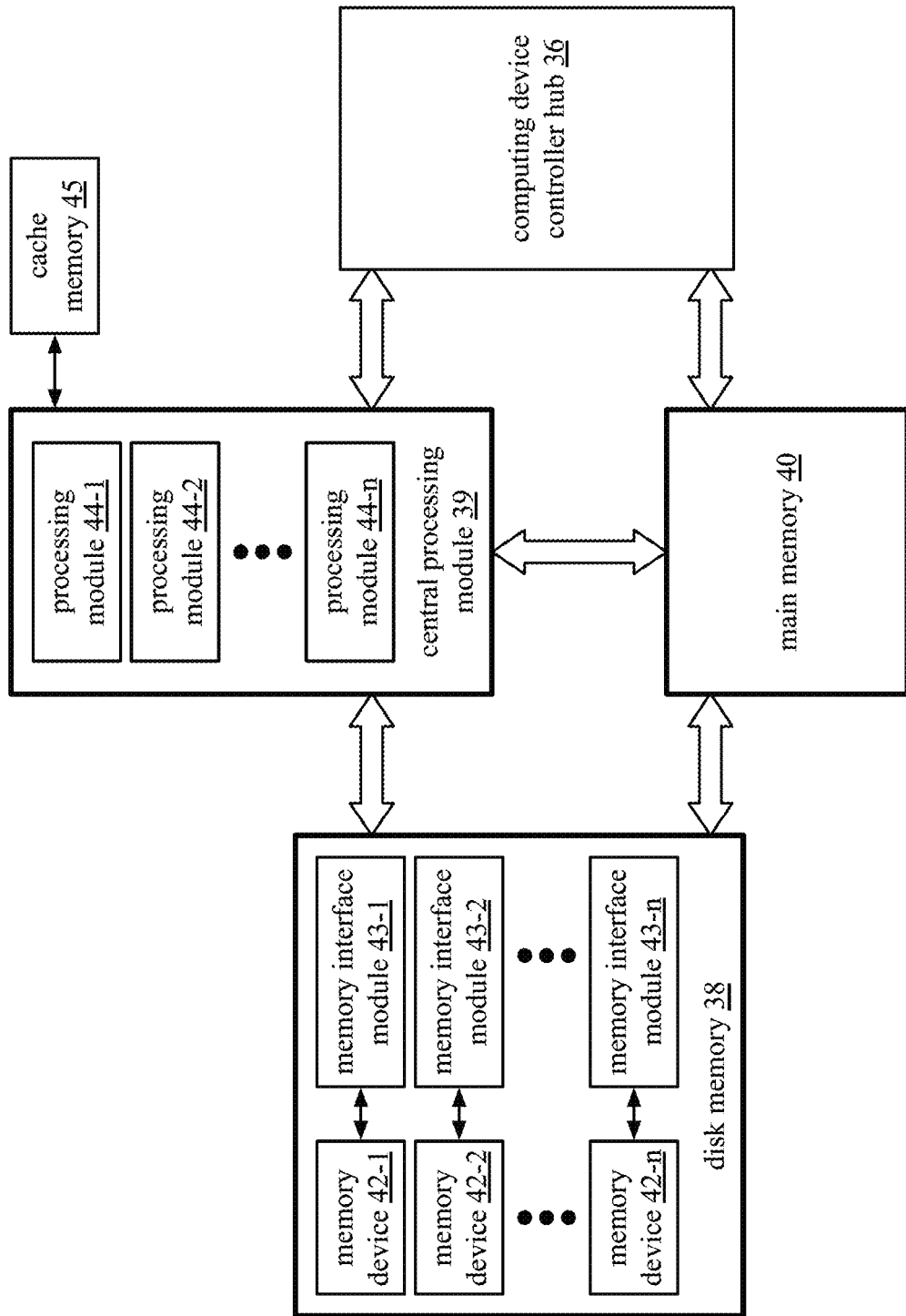
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
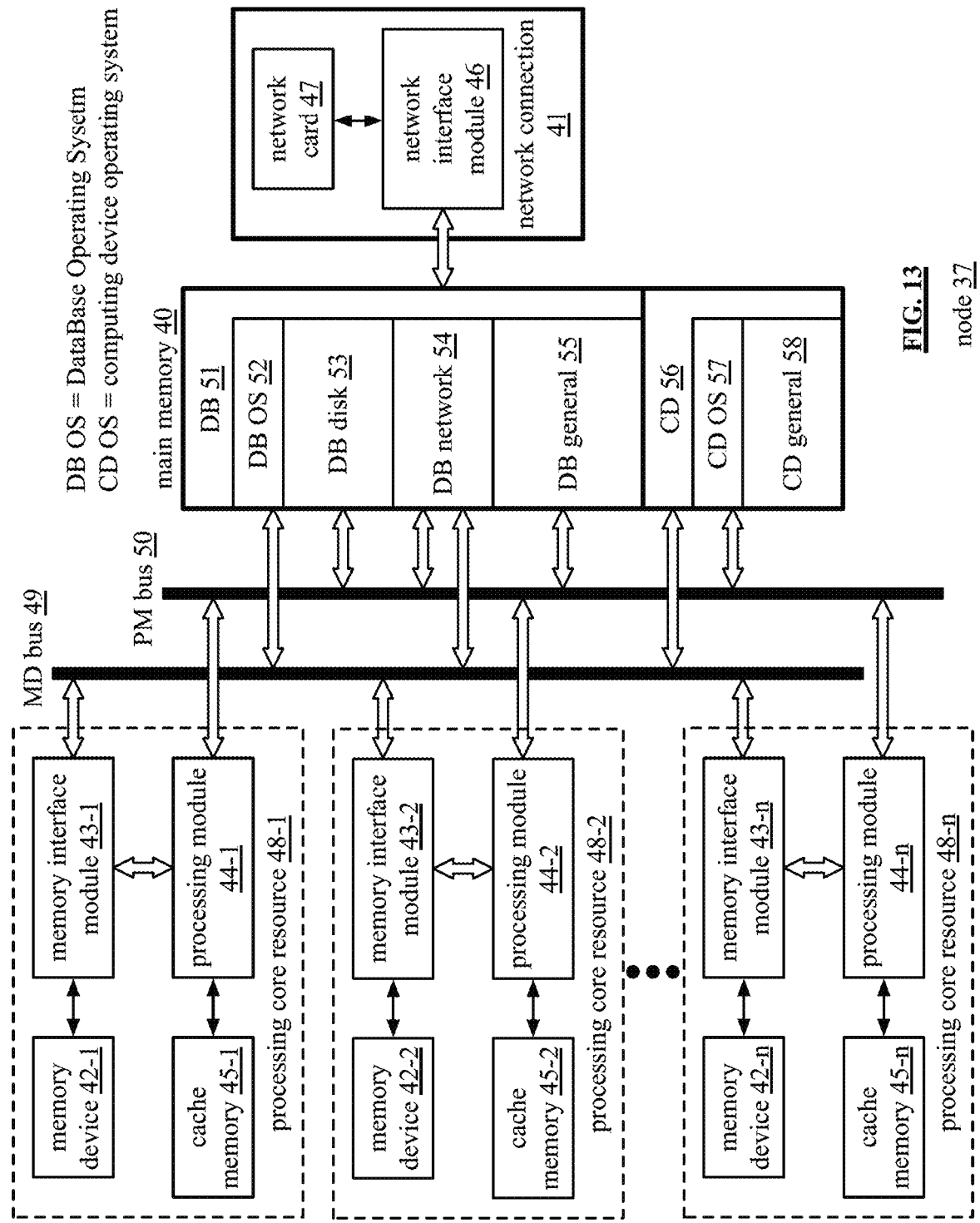
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource includes a corresponding processing module of processing modules 44-1 through 44-n, a corresponding memory interface module of memory interface modules 43-1 through 43-n, a corresponding memory device of memory devices 42-1 through 42-n, and a corresponding cache memory of cache memories 45-1 through 45-n. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58. Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
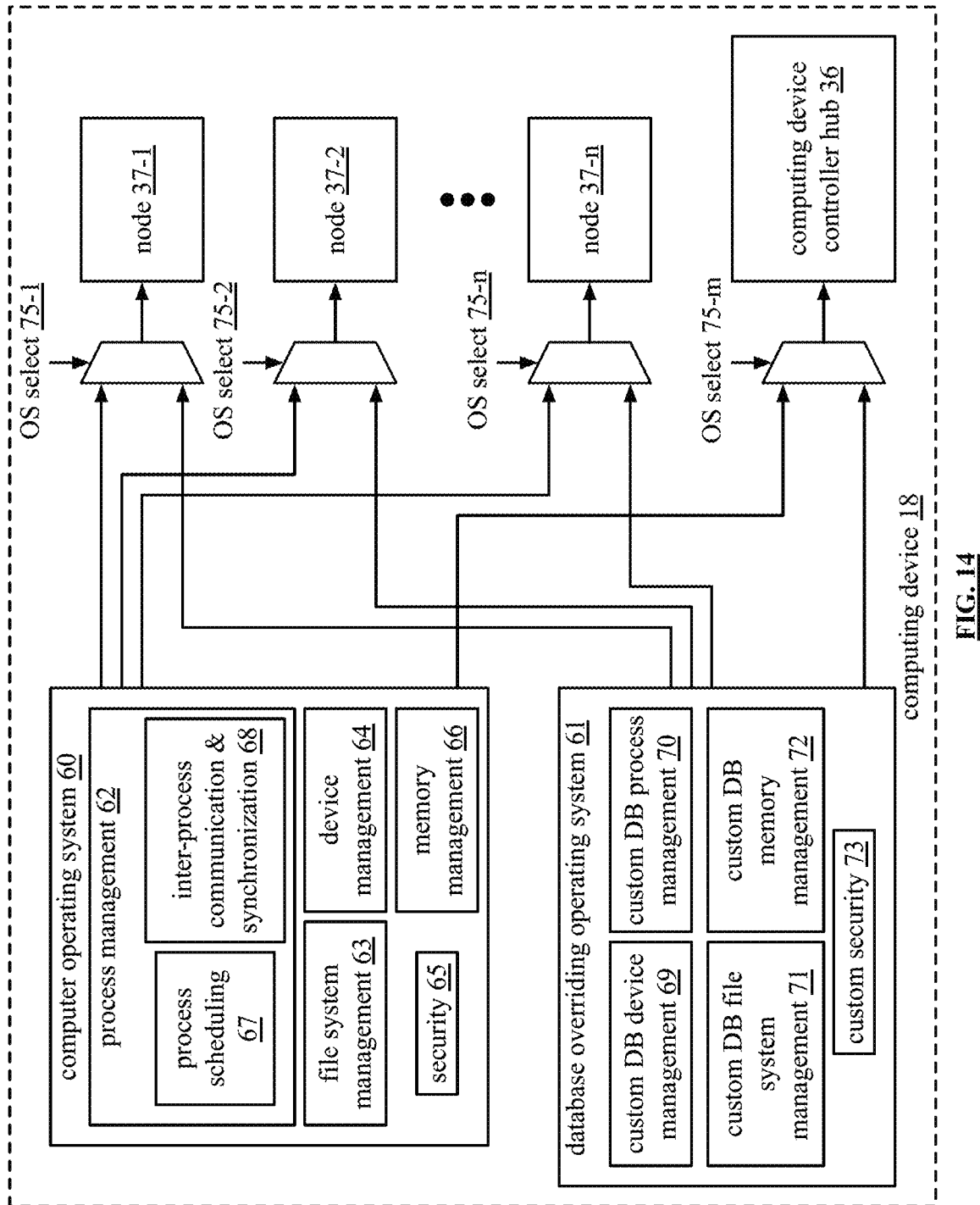
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-n and via OS select 75-m when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
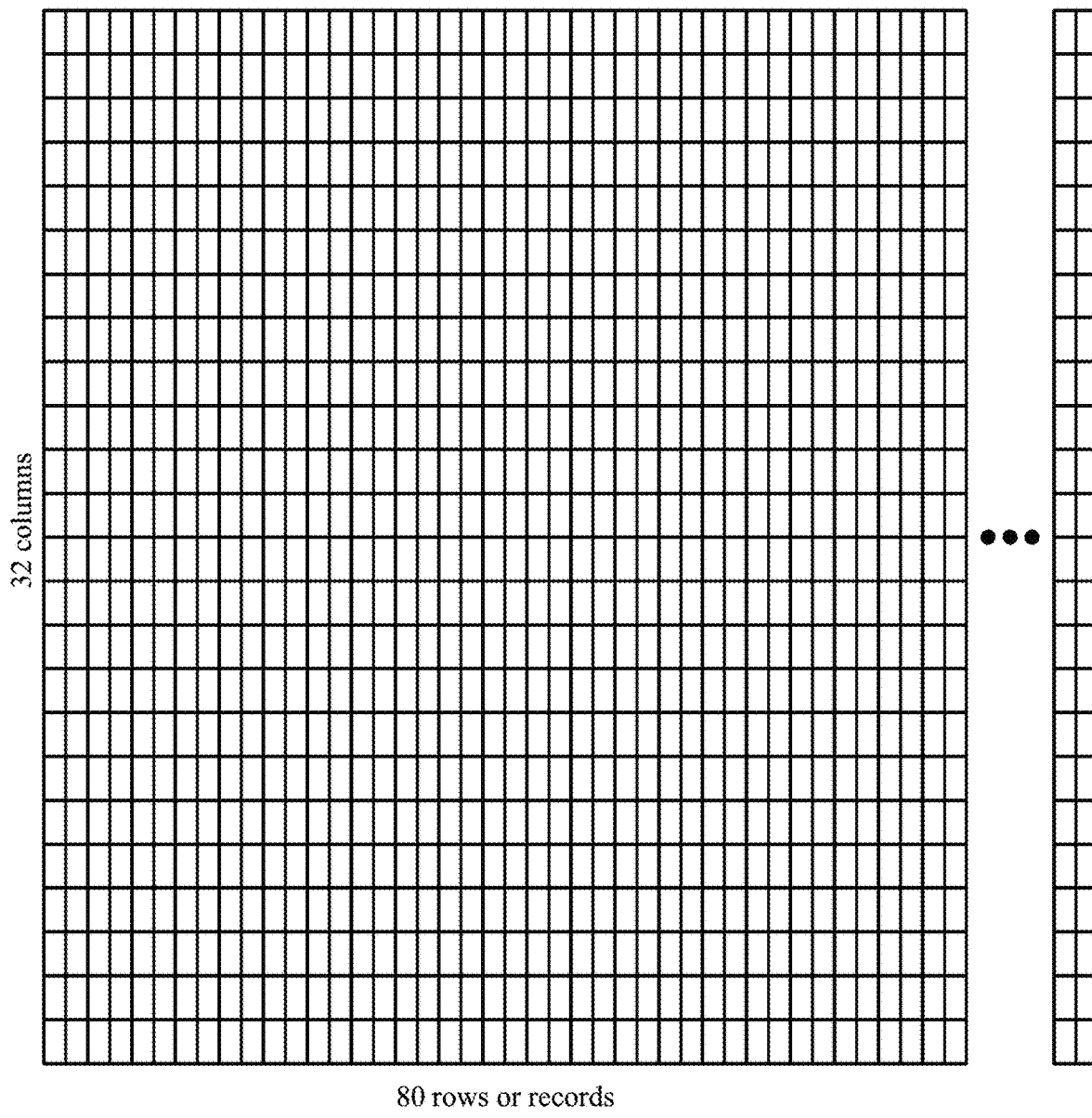

FIGS. 15-25 are schematic block diagrams of an example of processing a table or data set for storage in the database system. FIG. 15 illustrates an example of a data set or table that includes 32 columns and 80 rows, or records, that is received by the parallelized data input-subsystem. This is a very small table, but is sufficient for illustrating one or more concepts regarding one or more aspects of a database system. The table is representative of a variety of data ranging from insurance data, to financial data, to employee data, to medical data, and so on.

Figure 16:
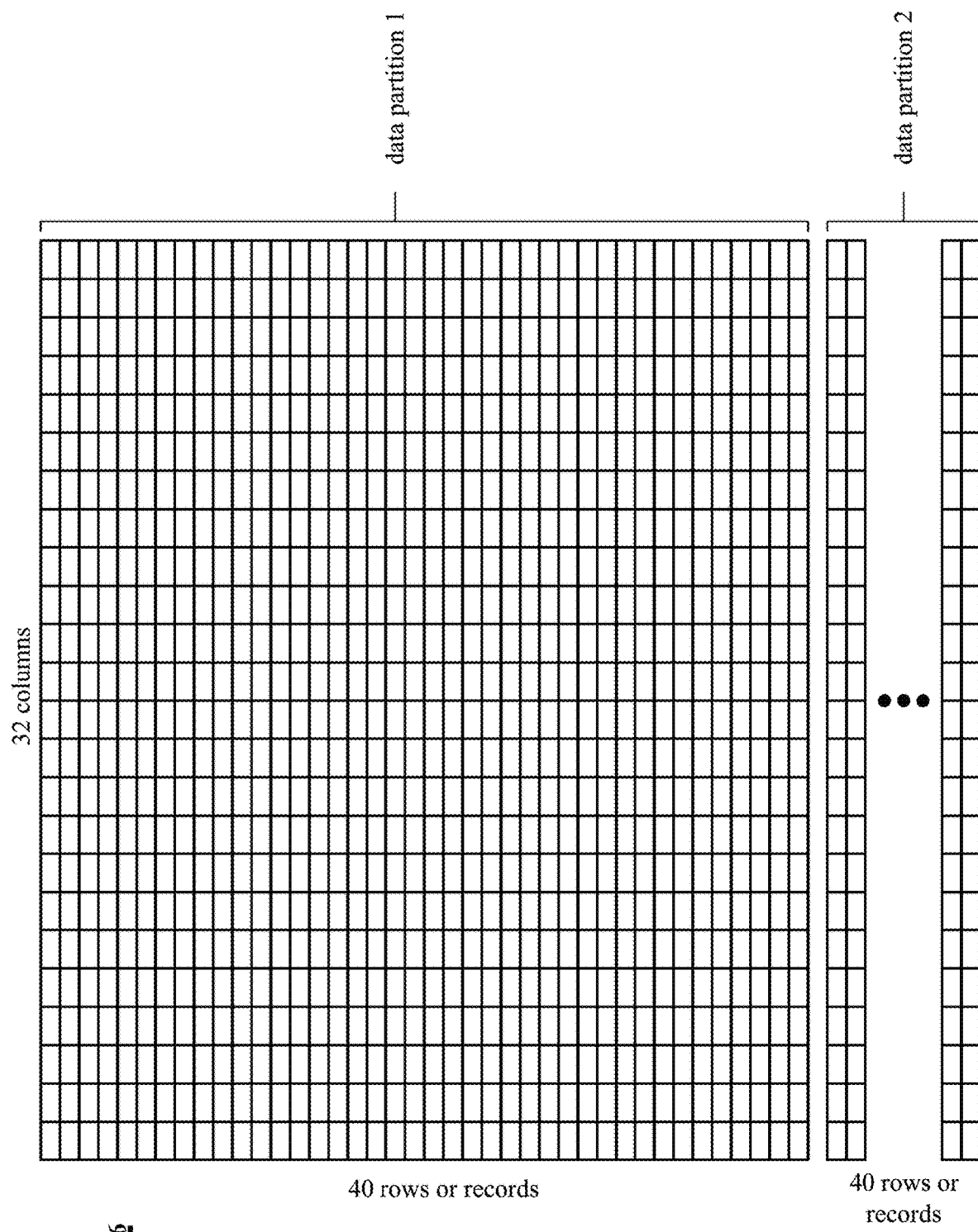

FIG. 16 illustrates an example of the parallelized data input-subsystem dividing the data set into two partitions. Each of the data partitions includes 40 rows, or records, of the data set. In another example, the parallelized data input-subsystem divides the data set into more than two partitions. In yet another example, the parallelized data input-subsystem divides the data set into many partitions and at least two of the partitions have a different number of rows.

Figure 17:
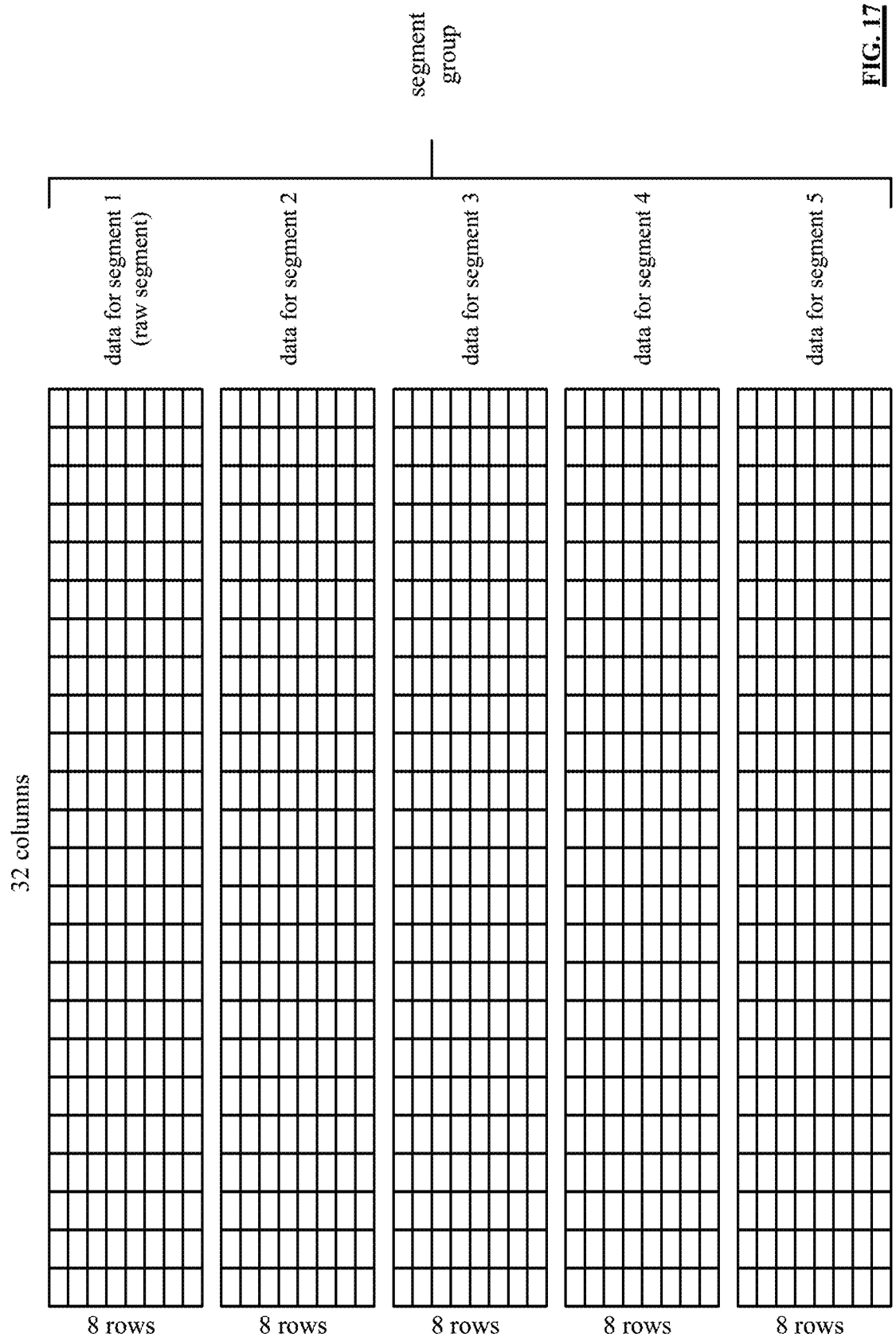

FIG. 17 illustrates an example of the parallelized data input-subsystem dividing a data partition into a plurality of segments to form a segment group. The number of segments in a segment group is a function of the data redundancy encoding. In this example, the data redundancy encoding is single parity encoding from four data pieces; thus, five segments are created. In another example, the data redundancy encoding is a two parity encoding from four data pieces; thus, six segments are created. In yet another example, the data redundancy encoding is single parity encoding from seven data pieces; thus, eight segments are created.

FIG. 18 illustrates an example of data for segment 1 of the segments of FIG. 17. The segment is in a raw form since it has not yet been key column sorted. As shown, segment 1 includes 8 rows and 32 columns. The third column is selected as the key column and the other columns stored various pieces of information for a given row (i.e., a record).

As an example, the table is regarding a fleet of vehicles. Each row represents data regarding a unique vehicle. The first column stores a vehicle ID, the second column stores make and model information of the vehicle. The third column stores data as to whether the vehicle is on or off. The remaining columns store data regarding the operation of the vehicle such as mileage, gas level, oil level, maintenance information, routes taken, etc.

With the third column selected as the key column, the other columns of the segment are to be sorted based on the key column. Prior to sorted, the columns are separated to form data slabs. As such, one column is separated out to form one data slab.

FIG. 19 illustrates an example of the parallelized data input-subsystem dividing segment 1 of FIG. 18 into a plurality of data slabs. A data slab is a column of segment 1. In this figure, the data of the data slabs has not been sorted. Once the columns have been separated into data slabs, each data slab is sorted based on the key column. Note that more than one key column may be selected and used to sort the data slabs based on two or more other columns.

FIG. 20 illustrates an example of the parallelized data input-subsystem sorting the each of the data slabs based on the key column. In this example, the data slabs are sorted based on the third column which includes data of "on" or "off". The rows of a data slab are rearranged based on the key column to produce a sorted data slab. Each segment of the segment group is divided into similar data slabs and sorted by the same key column to produce sorted data slabs.

Figure 21:
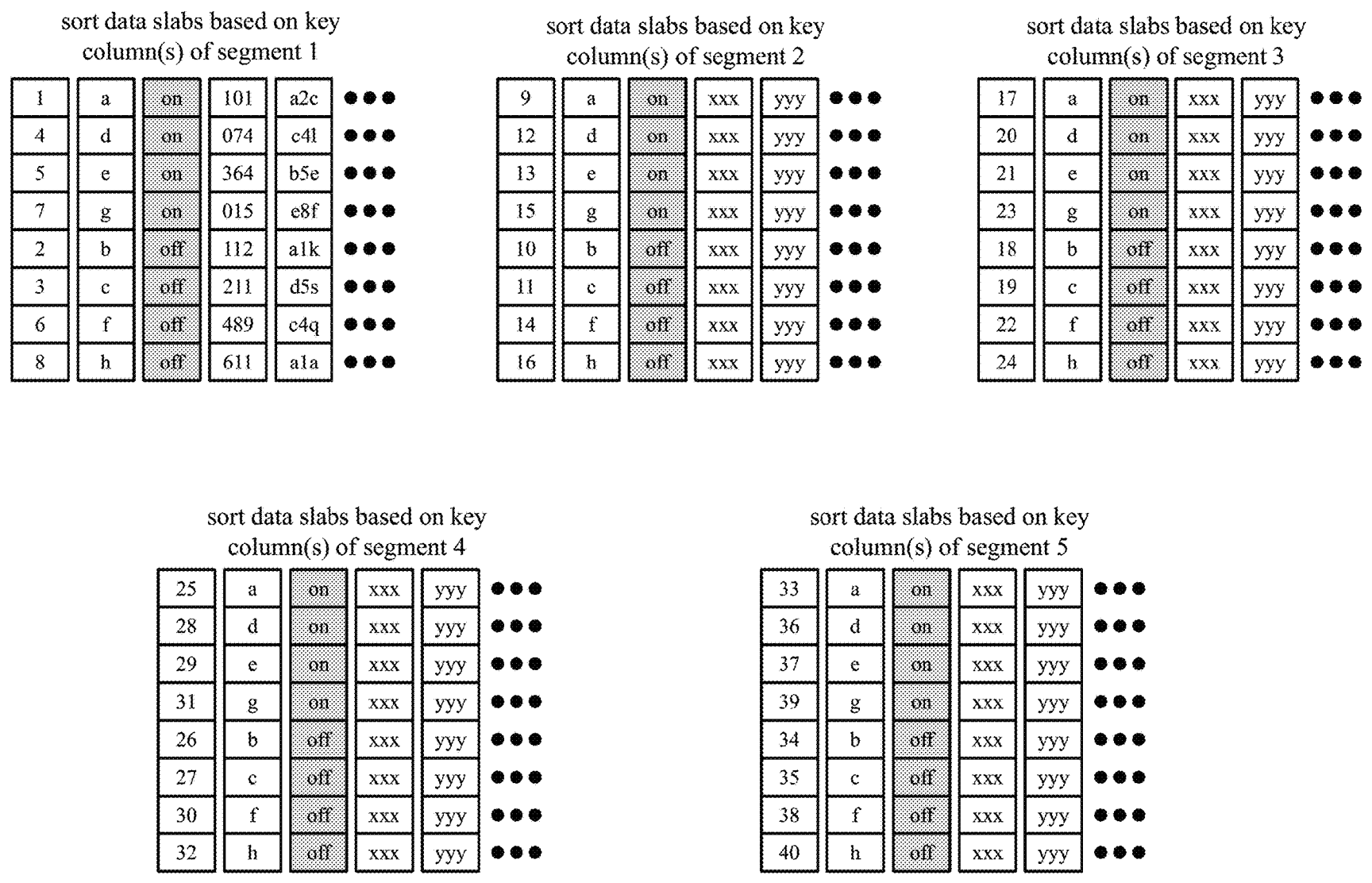

FIG. 21 illustrates an example of each segment of the segment group sorted into sorted data slabs. The similarity of data from segment to segment is for the convenience of illustration. Note that each segment has its own data, which may or may not be similar to the data in the other sections.

Figure 22:
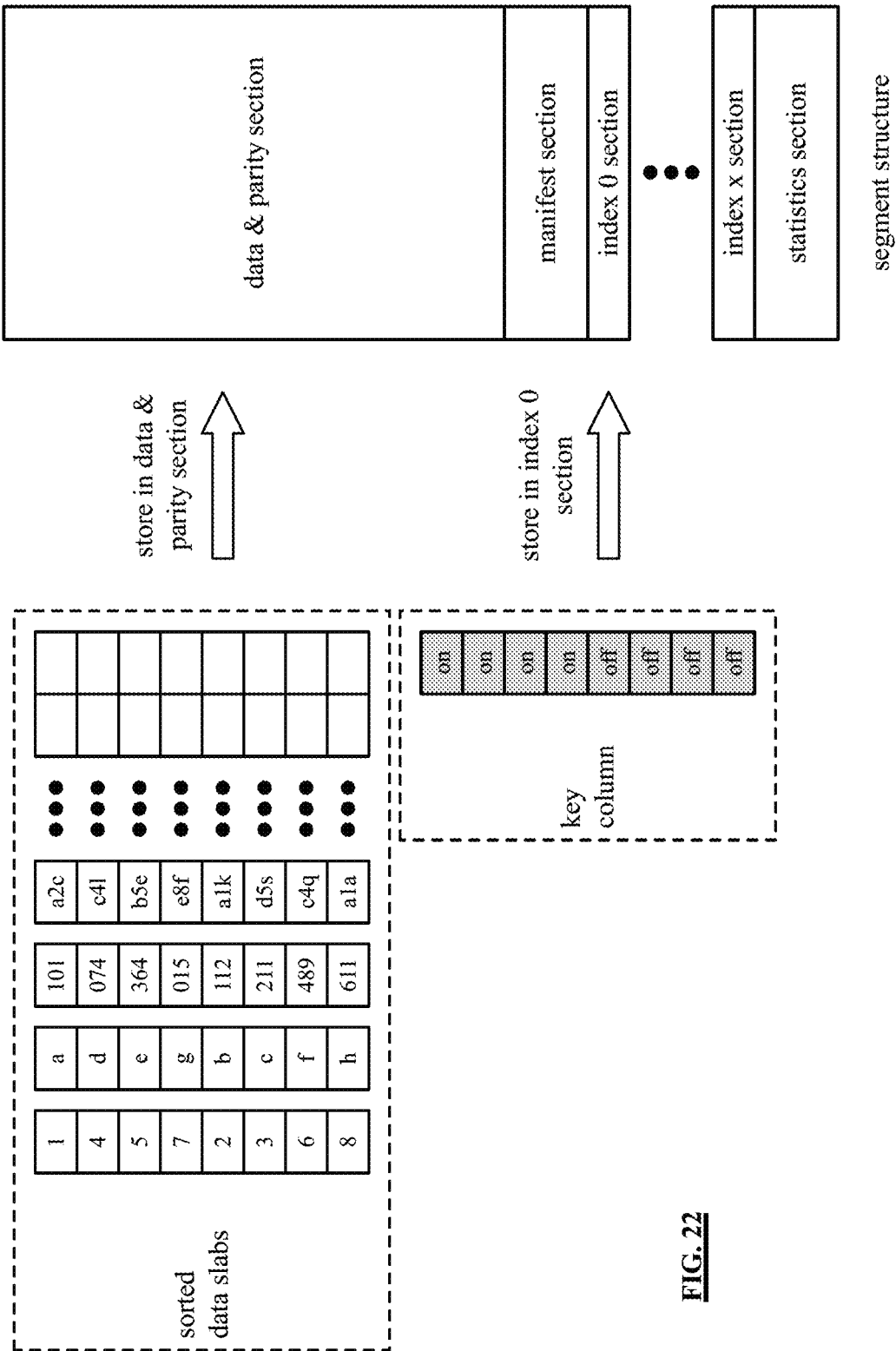

FIG. 22 illustrates an example of a segment structure for a segment of the segment group. The segment structure for a segment includes the data & parity section, a manifest section, one or more index sections, and a statistics section. The segment structure represents a storage mapping of the data (e.g., data slabs and parity data) of a segment and associated data (e.g., metadata, statistics, key column(s), etc.) regarding the data of the segment. The sorted data slabs of FIG. 16 of the segment are stored in the data & parity section of the segment structure. The sorted data slabs are stored in the data & parity section in a compressed format or as raw data (i.e., non-compressed format). Note that a segment structure has a particular data size (e.g., 32 Giga-Bytes) and data is stored within in coding block sizes (e.g., 4 Kilo-Bytes).

Before the sorted data slabs are stored in the data & parity section, or concurrently with storing in the data & parity section, the sorted data slabs of a segment are redundancy encoded. The redundancy encoding may be done in a variety of ways. For example, the redundancy encoding is in accordance with RAID 5, RAID 6, or RAID 10. As another example, the redundancy encoding is a form of forward error encoding (e.g., Reed Solomon, Trellis, etc.). An example of redundancy encoding is discussed in greater detail with reference to one or more of FIGS. 29-36.

The manifest section stores metadata regarding the sorted data slabs. The metadata includes one or more of, but is not limited to, descriptive metadata, structural metadata, and/or administrative metadata. Descriptive metadata includes one or more of, but is not limited to, information regarding data such as name, an abstract, keywords, author, etc. Structural metadata includes one or more of, but is not limited to, structural features of the data such as page size, page ordering, formatting, compression information, redundancy encoding information, logical addressing information, physical addressing information, physical to logical addressing information, etc. Administrative metadata includes one or more of, but is not limited to, information that aids in managing data such as file type, access privileges, rights management, preservation of the data, etc.

The key column is stored in an index section. For example, a first key column is stored in index #0. If a second key column exists, it is stored in index #1. As such, for each key column, it is stored in its own index section. Alternatively, one or more key columns are stored in a single index section.

The statistics section stores statistical information regarding the segment and/or the segment group. The statistical information includes one or more of, but is not limited to, number of rows (e.g., data values) in one or more of the sorted data slabs, average length of one or more of the sorted data slabs, average row size (e.g., average size of a data value), etc. The statistical information includes information regarding raw data slabs, raw parity data, and/or compressed data slabs and parity data.

Figure 23:
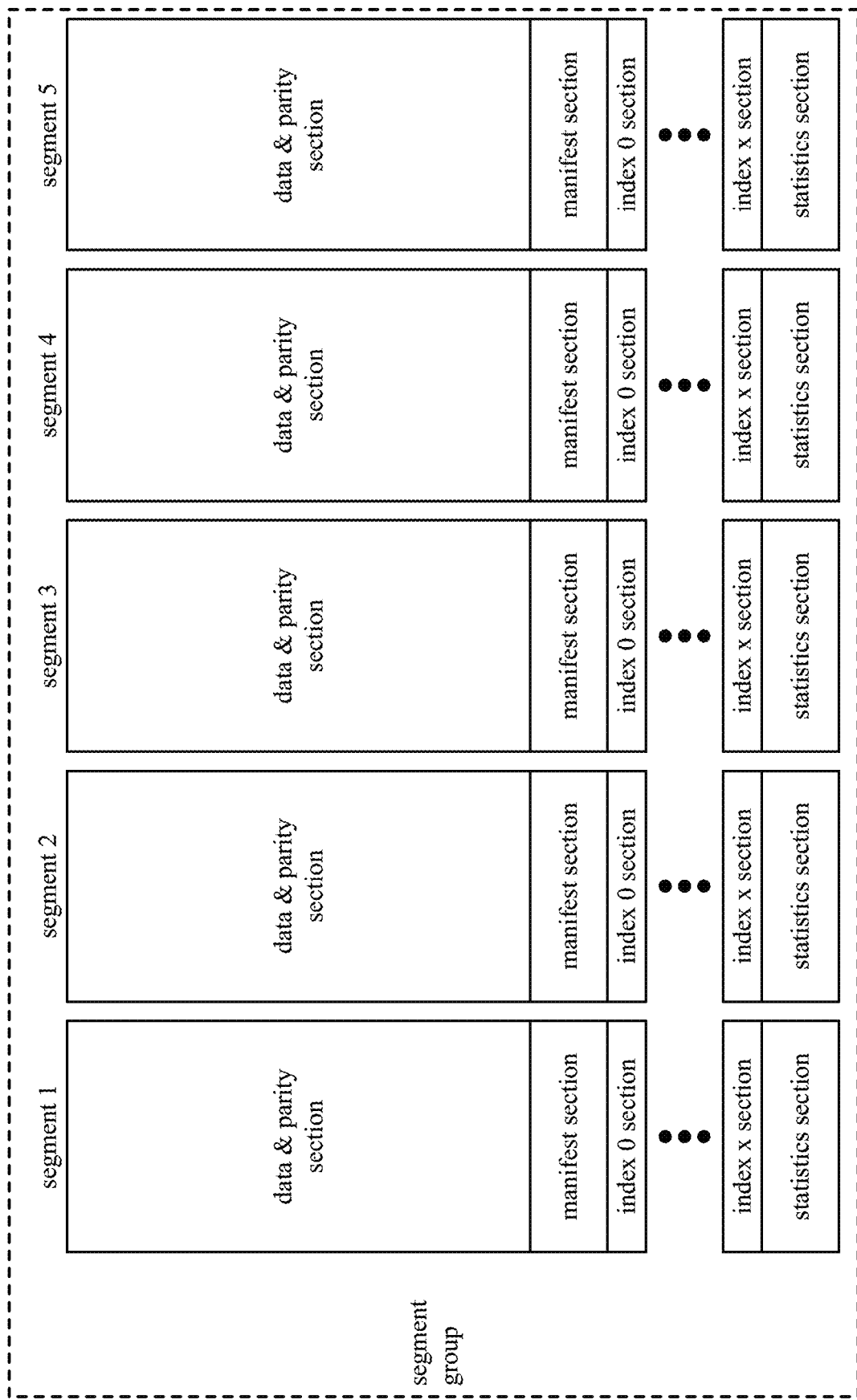

FIG. 23 illustrates the segment structures for each segment of a segment group having five segments. Each segment includes a data & parity section, a manifest section, one or more index sections, and a statistic section. Each segment is targeted for storage in a different computing device of a storage cluster. The number of segments in the segment group corresponds to the number of computing devices in a storage cluster. In this example, there are five computing devices in a storage cluster. Other examples include more or less than five computing devices in a storage cluster.

Figure 24:
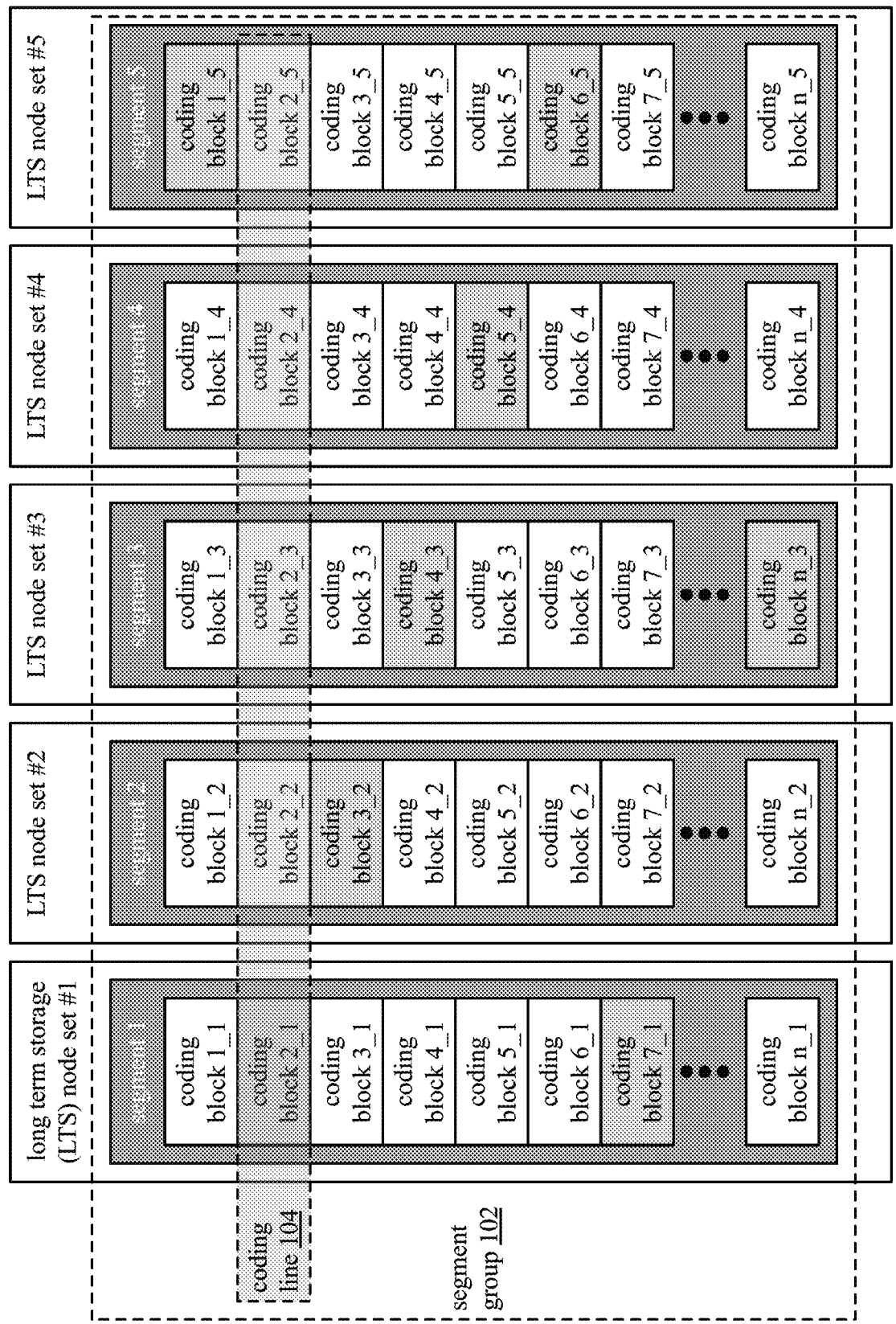

FIG. 24 illustrates an example of redundancy encoding using single parity encoding. The data of each segment of a second group 102 is divided into data blocks (e.g., 4 K bytes). The data blocks of the segments are logically aligned such that the first data blocks of the segments are aligned. For example, coding block 1_1 (the first number represents the code block number in the segment and the second number represents the segment number, thus 1_1 is the first code block of the first segment) is aligned with the first code block of the second segment (code block 1_2), the first code block of the third segment (code block 1_3), and the first code block of the fourth segment (code block 1_4). This forms a data portion of a coding line 104.

The four data coding blocks are exclusively ORed together to form a parity coding block, which is represented by the gray shaded block 1_5. The parity coding block is placed in segment 5 as the first coding block. As such, the first coding line includes four data coding blocks and one parity coding block. Note that the parity coding block is typically only used when a data code block is lost or has been corrupted. Thus, during normal operations, the four data coding blocks are used.

To balance the reading and writing of data across the segments of a segment group, the positioning of the four data coding blocks and the one parity coding block are distributed. For example, the position of the parity coding block from coding line to coding line is changed. In the present example, the parity coding block, from coding line to coding line, follows the modulo pattern of 5, 1, 2, 3, and 4. Other distribution patterns may be used. In some instances, the distribution does not need to be equal. Note that the redundancy encoding may be done by one or more computing devices 18 of the parallelized data input sub-system 11 and/or by one or more computing devices of the parallelized data store, retrieve, &/or process sub-system 12.

Figure 25:
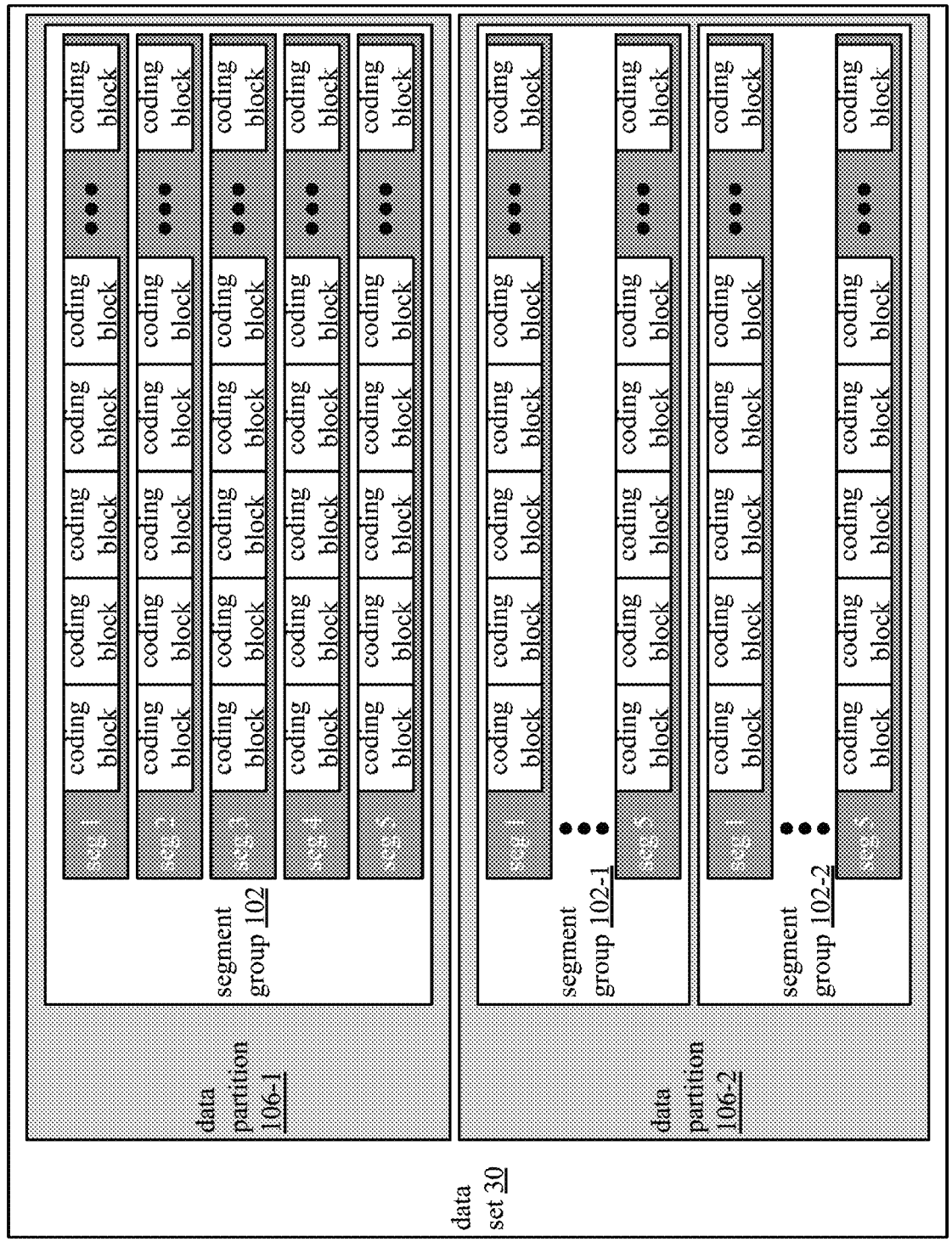

FIG. 25 illustrates an overlay of the dividing of a data set 30 (e.g., a table) into data partitions 106-1 and 106-2. Each partition is then divided into one or more segment groups 102. Each segment group 102 includes a number of segments. Each segment is further divided into coding blocks, which include data coding blocks and parity coding blocks.

Figure 26:
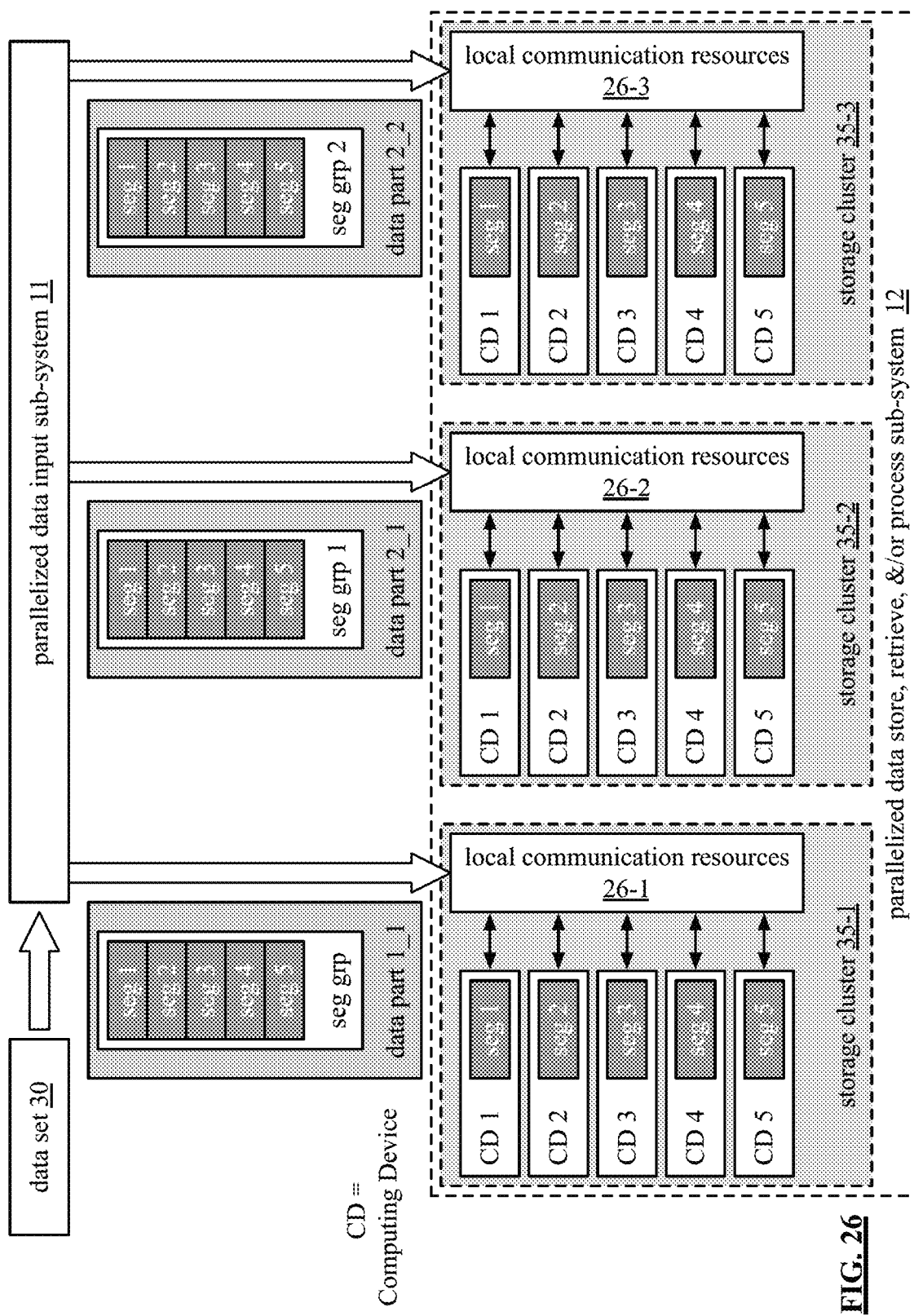
FIGS. 26-28 are schematic block diagrams of an example of storing a processed table or data set in the database system in accordance with the present invention.

FIG. 26 is a schematic block diagrams of an example of storing a processed table or data set 30 in the database system 10. In this example, the parallelized data input sub-system 11 sends, via local communication resources 26-1 through 26-3, segment groups of data partitions of the data set 30 (e.g., table) to storage clusters 35-1 through 35-3 of the parallelized data store, retrieve, &/or process sub-system 12. In this example, each storage cluster includes five computing devices, as such, a segment group includes five segments.

Each storage cluster has a primary computing device 18 for receiving incoming segment groups. The primary computing device 18 is randomly selected for each ingesting of data or is selected in a predetermined manner (e.g., a round robin fashion). The primary computing device 18 of each storage cluster 35 receives the segment group and then provides the segments to the computing devices 18 in its cluster 35; including itself. Alternatively, the parallelized data input-section 11 sends, via a local communication resource 26, each segment of a segment group to a particular computing device 18 within the storage clusters 35.

Figure 27:
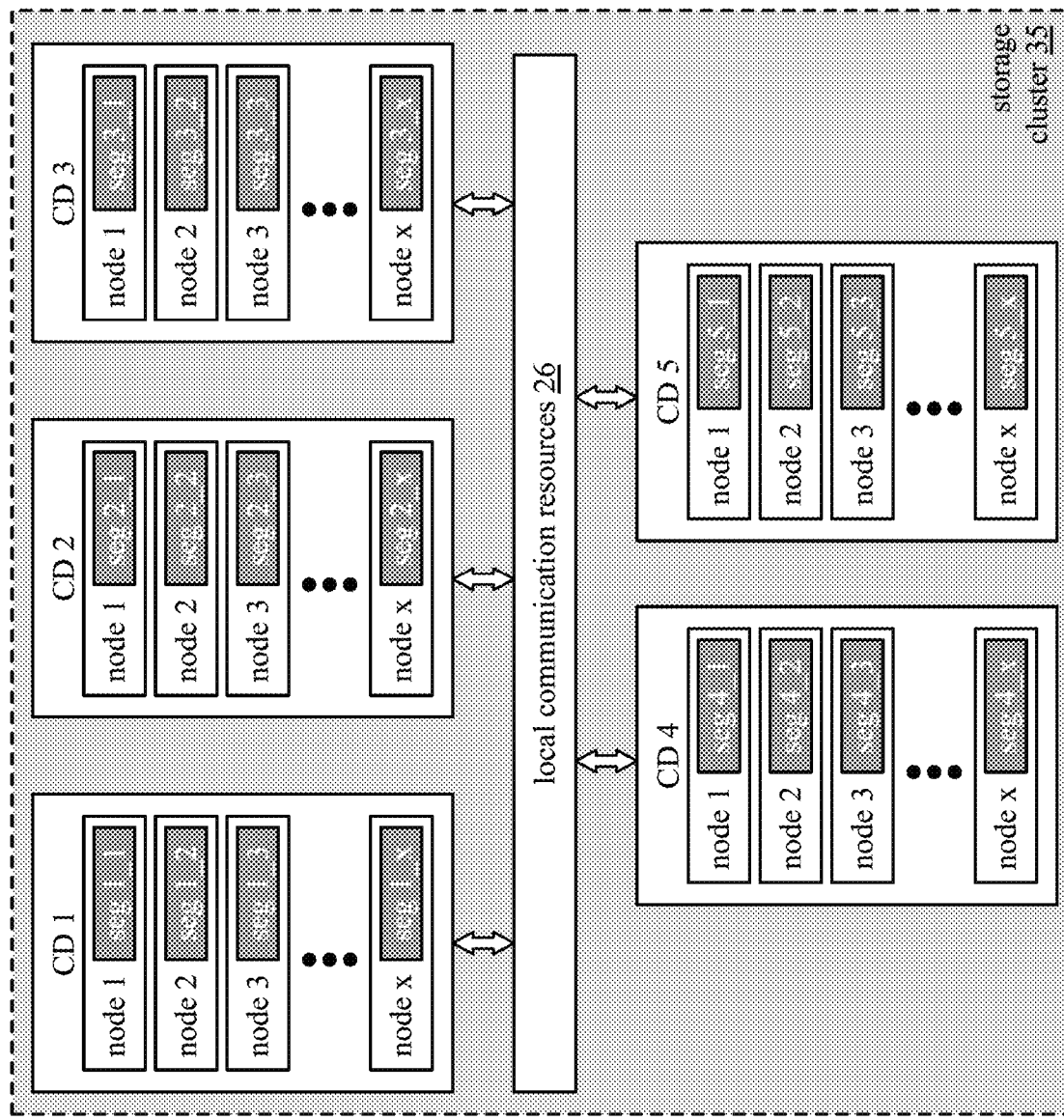

FIG. 27 illustrates a storage cluster 35 distributing storage of a segment group among its computing devices and the nodes within the computing device. Within each computing device, a node is selected as a primary node for dividing a segment into segment divisions and distributing the segment divisions to the nodes; including itself. For example, node 1 of computing device (CD) 1 receives segment 1. Having x number of nodes in the computing device 1, node 1 divides the segment into x segment divisions (e.g., seg 1_1 through seg 1_x, where the first number represents the segment number of the segment group and the second number represents the division number of the segment). Having divided the segment into divisions (which may include an equal amount of data per division, an equal number of coding blocks per division, an unequal amount of data per division, and/or an unequal number of coding blocks per division), node 1 sends the segment divisions to the respective nodes of the computing device.

Figure 28:
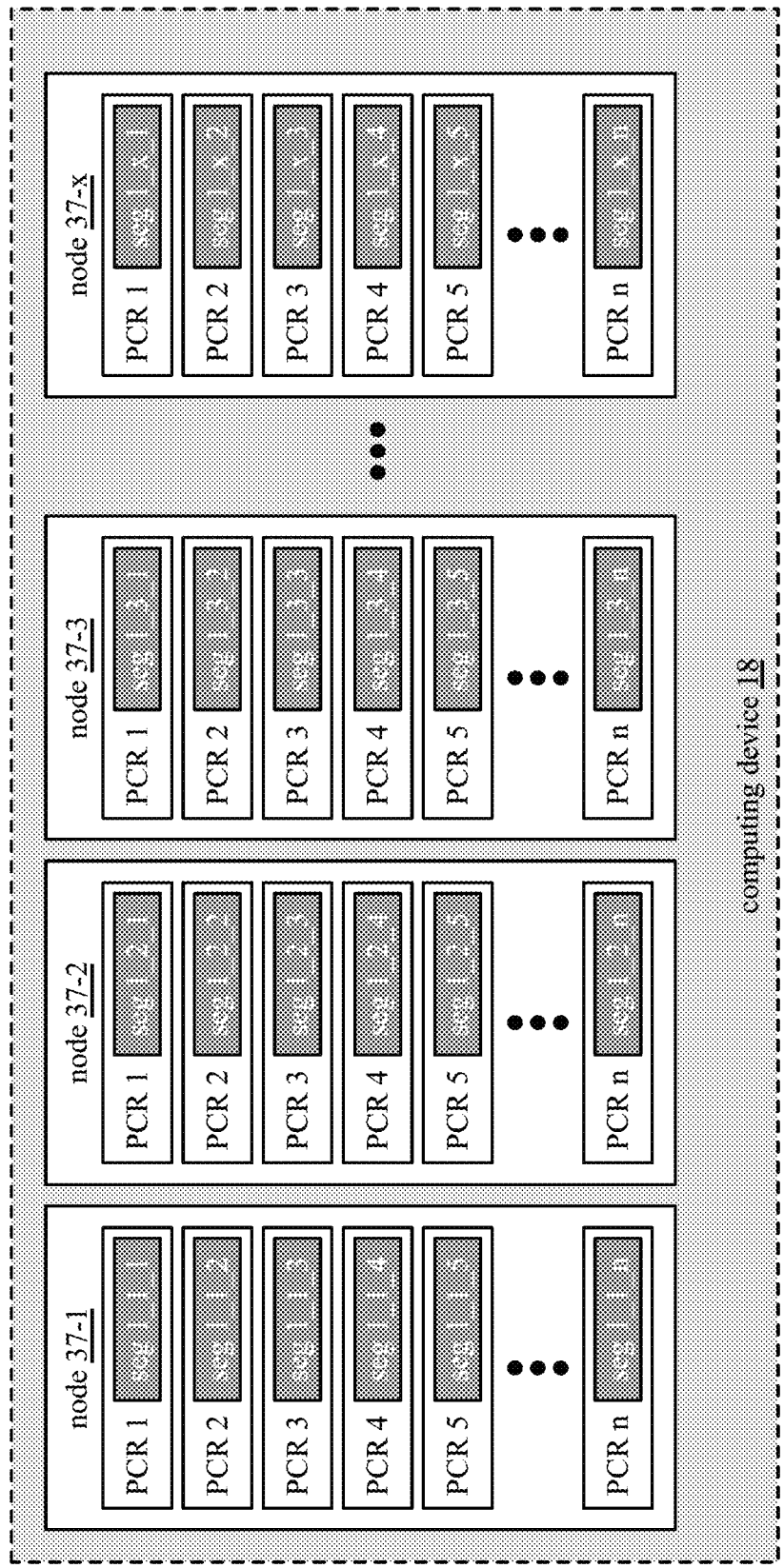

FIG. 28 illustrates notes 37-1 through 37-x of a computing device 18 distributing storage of a segment division among its processing core resources 48 (PCR). Within each node, a processing core resource (PCR) is selected as a primary PCR for dividing a segment division into segment sub-divisions and distributing the segment sub-divisions to the other PCRs of the node; including itself. For example, PCR 1 of node 1 of computing device 1 receives segment division 1_1. Having n number of PCRs in node 1, PCR 1 divides the segment division 1 into n segment sub-divisions (e.g., seg 1_1_1 through seg 1_1_n, where the first number represents the segment number of the segment group, the second number represents the division number of the segment, and the third number represents the sub-division number). Having divided the segment division into sub-divisions (which may include an equal amount of data per sub-division, an equal number of coding blocks per sub-division, an unequal amount of data per sub-division, and/or an unequal number of coding blocks per sub-division), PCR 1 sends the segment sub-divisions to the respective PCRs of node 1 of computing device 1.

Figure 29:
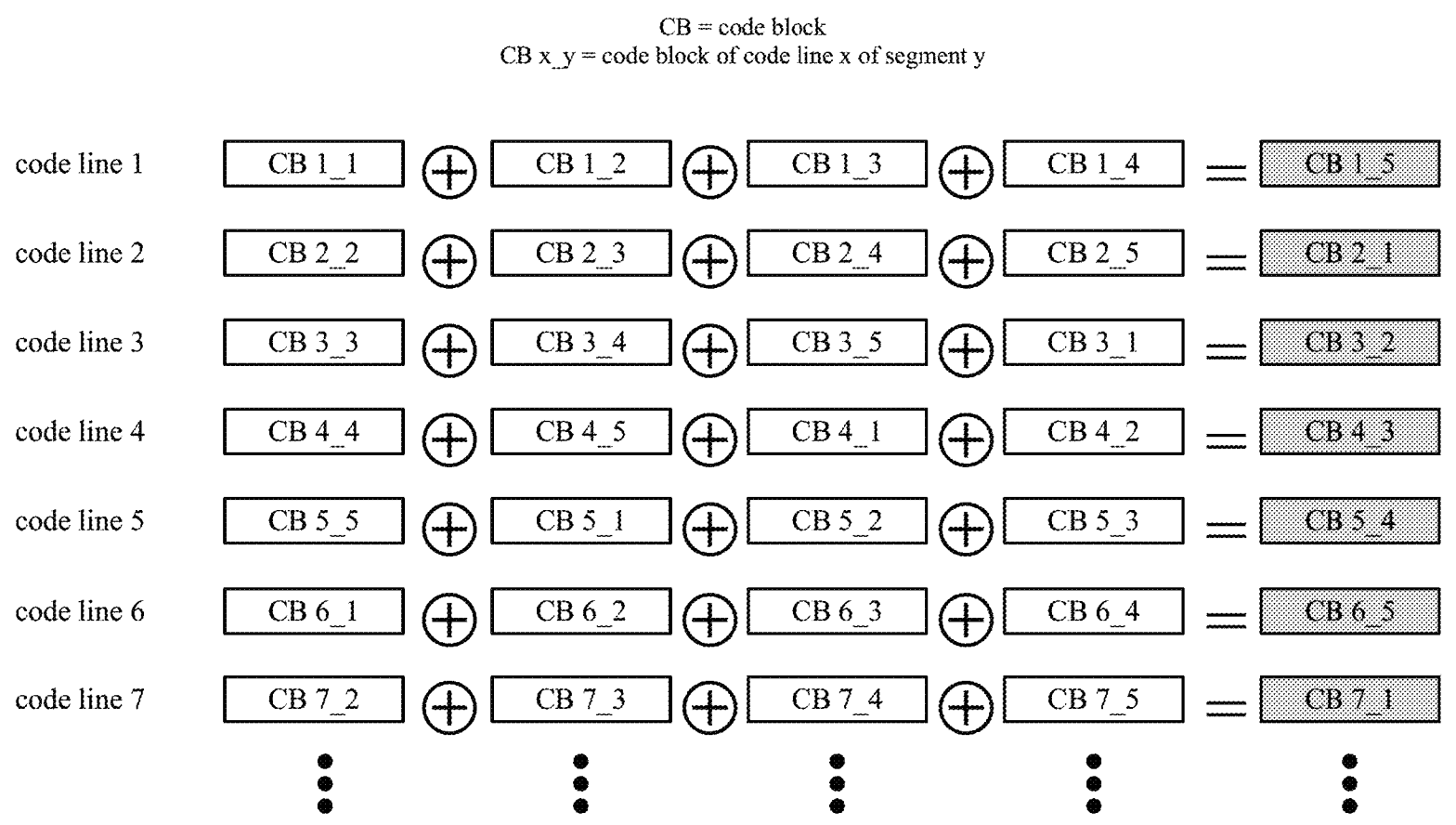

FIG. 29 is a schematic block diagram of an example of encoding a code line of data. Data is divided into groups of segments and segments are further divided into data blocks (e.g., coding blocks (CBs)). A parity calculation is done on the coding block level allowing for the smallest unit of data recovery (e.g., a coding block or data block, 4 Kbytes). In this example, data is divided into 5 segments where each segment is divided into a plurality of coding blocks. Four coding blocks from four of the data segments are arranged into a code line to calculate a fifth coding block (i.e., a parity coding block or parity block) based on a 4 of 5 coding scheme.

Because coding blocks of segments are stored in separate storage nodes, four coding blocks from different segments are used to create a parity coding block to be stored with coding blocks of the segment not used in the parity calculation. For example, in code line 1 a XOR operation is applied to CB 1_1 (coding block of code line 1 of segment 1), CB 1_2 (coding block of code line 1 of segment 2), CB 1_3, and CB 1_4 (coding block of code line 1 of segment 4) to create CB 1_5 (parity coding block of code line 1 of segment 5). As such, any combination of four code blocks out of five code blocks of a code line can be used to reconstruct a code block from that line.

Figure 30:
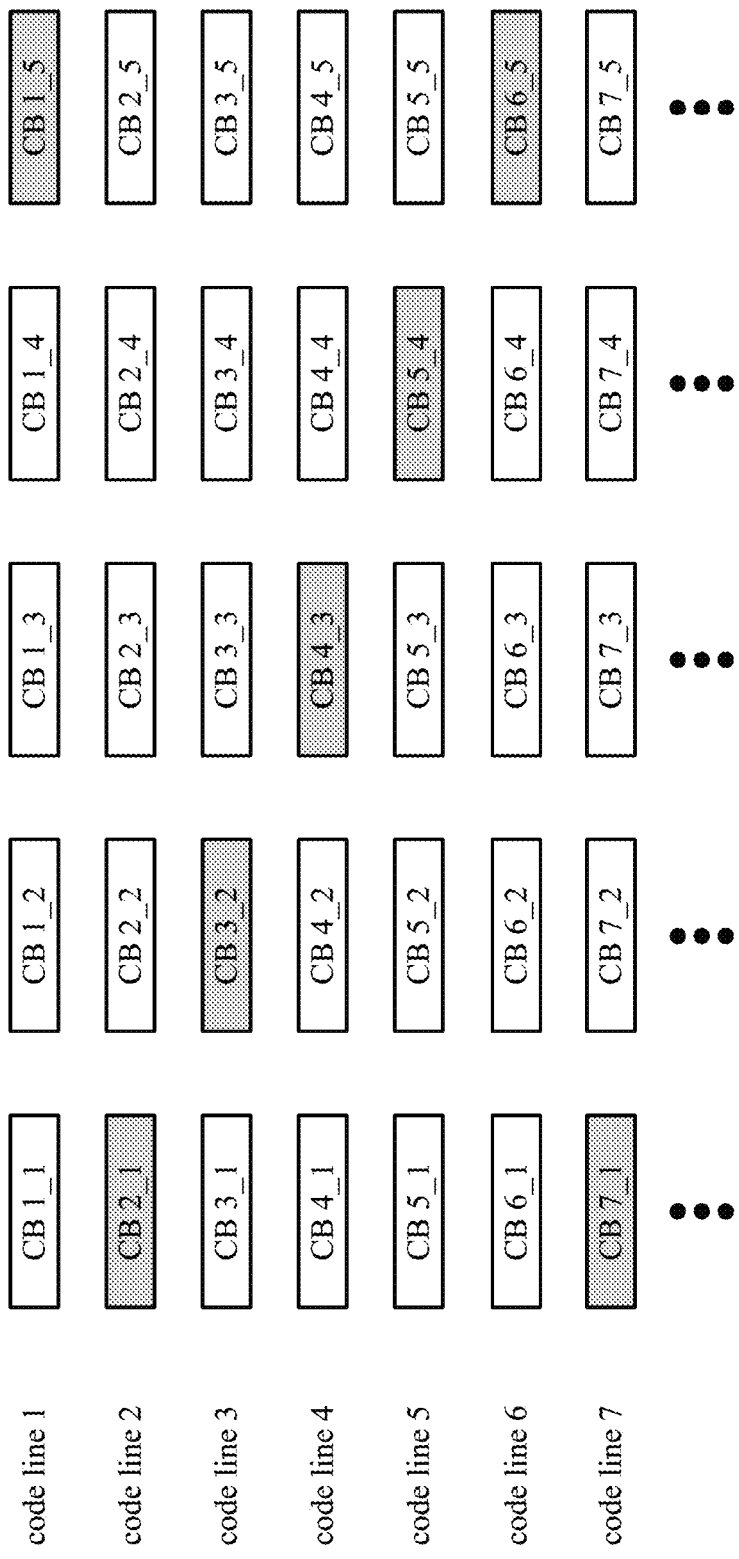
FIG. 30 is a schematic block diagram of an example of encoded code lines with distributed positioning of parity blocks in accordance with the present invention.

FIG. 30 is a schematic block diagram of an example of encoded code lines with distributed positioning of parity blocks. The parity blocks generated in the example of FIG. 29 (shown as shaded blocks) are distributed in accordance with a corresponding segment for storage. For example, parity blocks CB 2_1 and CB 7_1 are arranged with coding blocks of a first segment for storage in a first storage node, parity coding block CB 3_2 is arranged with coding blocks of a second segment for storage in a second storage node, parity coding block CB 4_3 is arranged with coding blocks of a third segment for storage in a third storage node, parity coding block 5_4 is arranged with coding blocks of a fourth segment for storage in a fourth storage node, and parity coding blocks CB 1_5 and CB 6_5 are arranged with coding blocks of a fifth segment for storage in a fifth storage node.

Using a dedicated parity storage node creates parity storage node bottlenecks for write operations. Therefore, distributing the parity coding blocks allows for more balanced data access and substantially fixes the write bottleneck issue.

Figure 31:
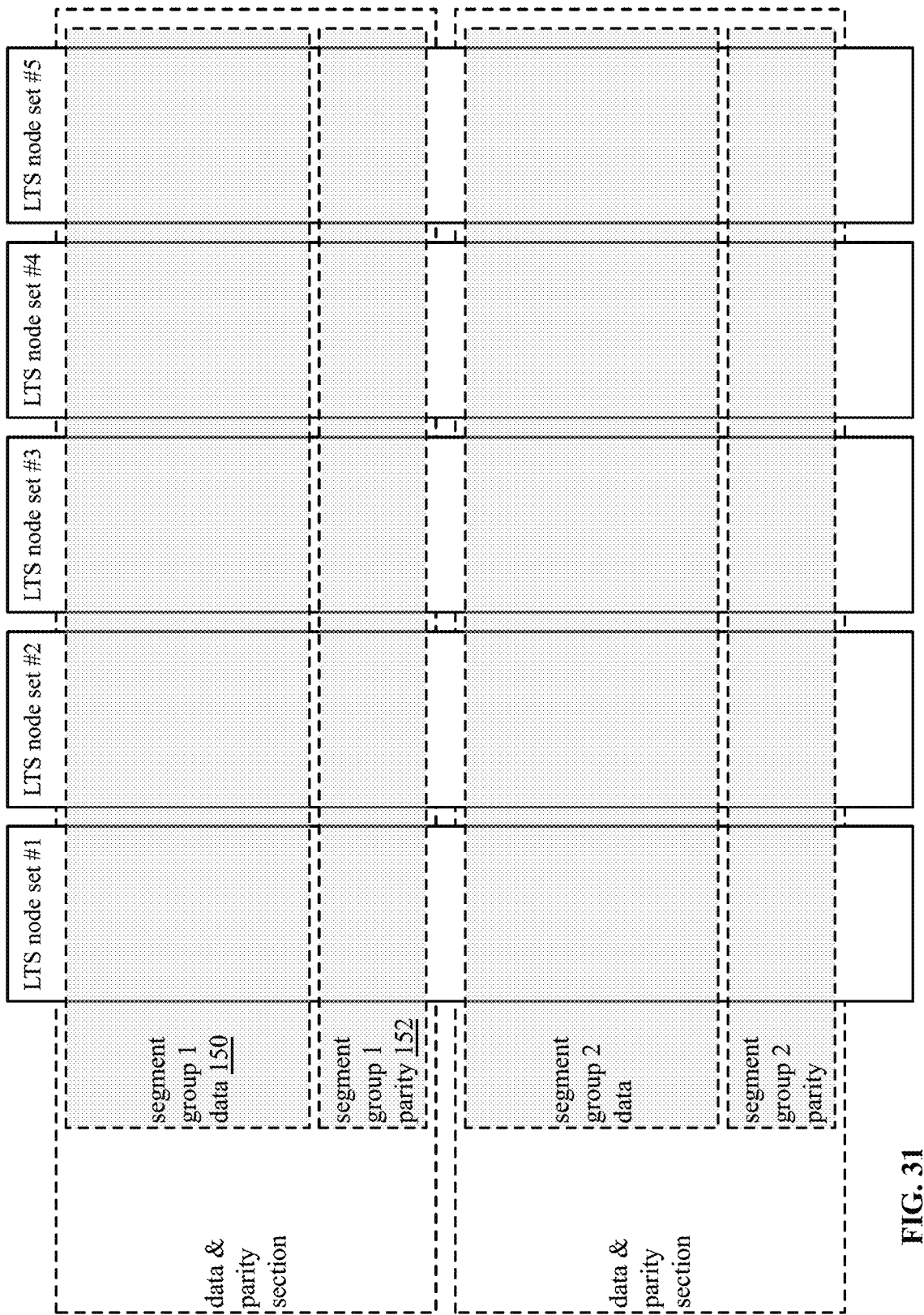
FIG. 31 is a schematic block diagram of an example of memory of a cluster of nodes and/or of computing devices having a data storage section and a parity storage section in accordance with the present invention.

FIG. 31 is a schematic block diagram of an example of memory of a cluster of nodes 35 and/or of computing devices 18 having the data & parity section of the segment structures for segment groups divided into a data storage section 150 and a parity storage section 152. Here, five long term storage (LTS) node sets (LTS node sets #1-5) are shown storing data that has been divided into five segments per segment group (e.g., each segment is assigned its own storage node). Segment group 1 is stored in the data & parity section of their respective segment structures and segment group 2 is stored in the data & parity section of their respective segment structures.

As previously discussed, the segments are further divided into pluralities of coding blocks and parity coding blocks (e.g., data blocks and parity blocks). Each of the data & parity sections and are divided into data section 150 and a parity section 152. The data blocks of the segments are stored in the data section 150 and the parity blocks are stored in the parity section 152 of each data & parity section of the segment structures.

Organizing the parity data in a separate storage section from the data within a storage node allows for greater data access efficiency. For example, parity data is only accessed when data requires reconstructing (e.g., data is lost, after a reboot, etc.). Other data access operations are achieved by accessing the data required from the data storage section.

Figure 32:
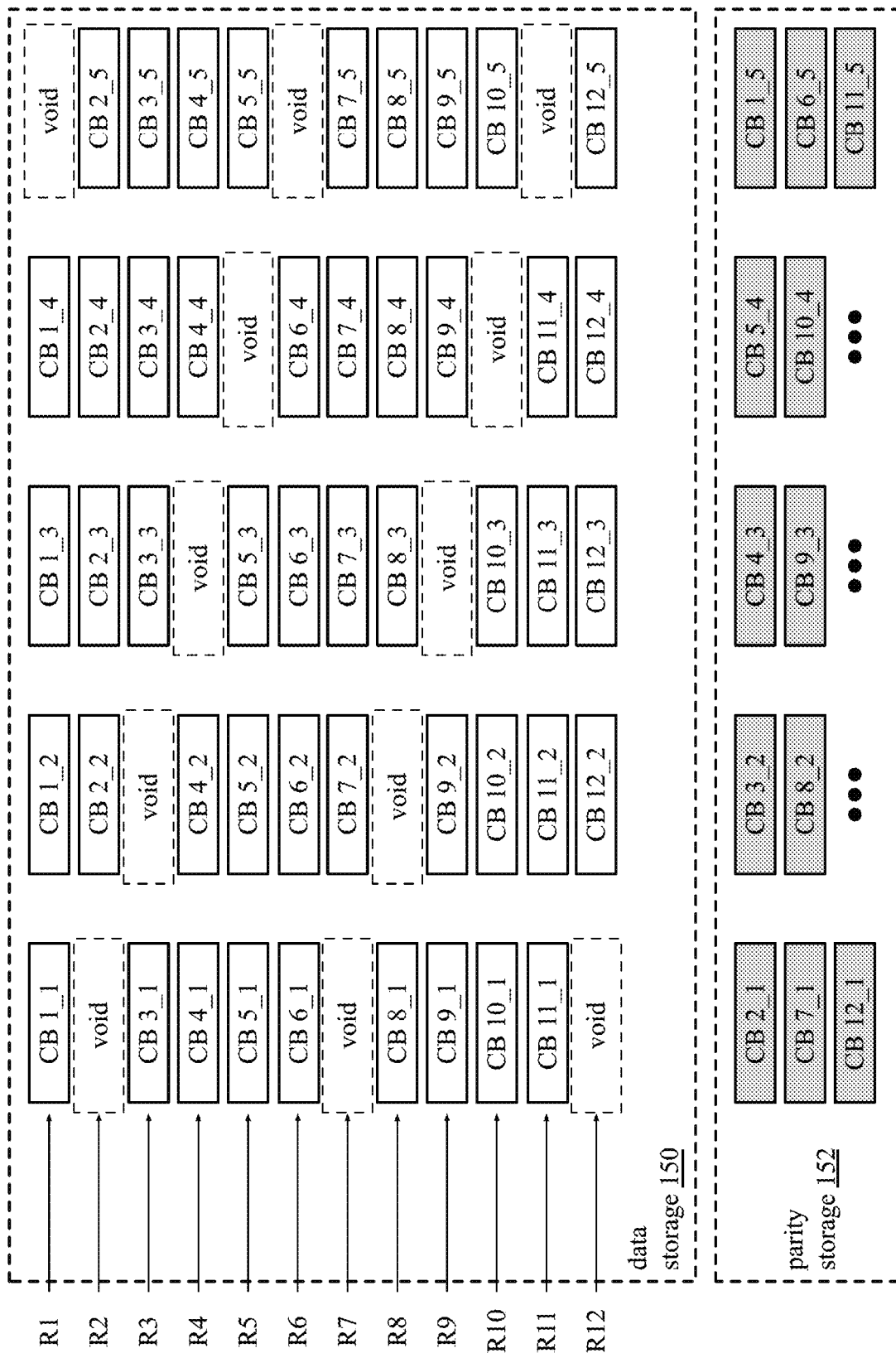
FIG. 32 is a schematic block diagram of an example of storing data blocks in a data storage section and parity blocks in a parity storage section, with empty spaces in the data storage section, in accordance with the present invention.

FIG. 32 is a schematic block diagram of an example of storing data blocks in a data storage section 150 and parity blocks in a parity storage section 152, with empty spaces (voids) in the data storage section 150. Five storage node sets (e.g., five computing devices) are shown storing data that has been divided into five segments (e.g., each segment requires its own storage node) and further divided into pluralities of data blocks (e.g., coding blocks (CBs)) and parity blocks. Distributing the parity blocks (as discussed in FIG. 30) and writing parity blocks in a parity storage section 152 (as discussed in FIG. 31) separate from the data storage sections 150 results in voids in the data storage section 150.

For example, parity blocks CB 2_1, CB 7_1, and CB 12_1 are stored in the parity storage section 152 of a first storage node resulting in three voids in the data storage section 150 of a first storage node as shown (e.g., in rows R2, R7, and R12). Various ways to fill voids in the data storage section 150 created from separating out the parity blocks are discussed in FIGS. 33-35.

Figure 33:
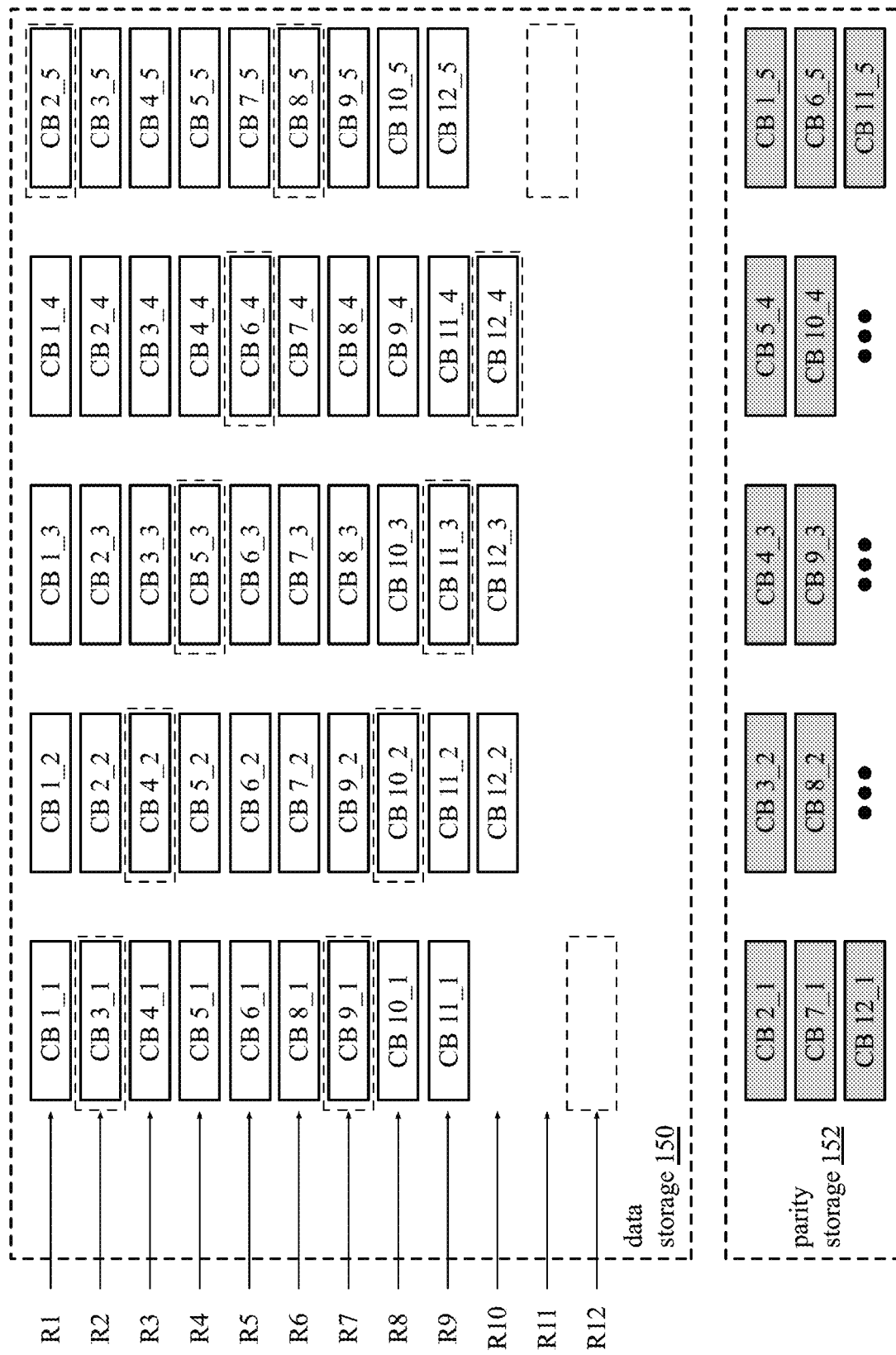
FIG. 33 is a schematic block diagram of an example of filling the empty spaces in the data storage section of FIG. 32 in accordance with the present invention.

FIG. 33 is a schematic block diagram of an example of filling the empty spaces in the data storage section 150 of FIG. 32. In this example, voids in the data storage section are filled by applying a mathematical function that includes a logical address adjustment that effectively pushes up data blocks (e.g., coding blocks (CBs)) in the data storage section 150 to fill the voids. For example, the mathematical function applied here effectively pushes up the data blocks in groups of four (e.g., the number of data blocks in a line of data blocks) to use a minimal amount of moves to fill voids. For example, parity blocks CB 2_1, CB 7_1, and CB 12_1 are written to the parity storage section 152 of a first storage node resulting in three voids in the data storage section 150 of the first storage node. CB 3_1-CB 6_1 are effectively pushed up to fill the void in R2 of the data storage section 150 of the first storage node thus forming a group of five coding blocks (CB 1_1, CB 3_1, CB 4_1, CB 5_1, and CB 6_1). CB 8_1-CB 11_1 are effectively pushed up to fill the void in R7 of the data storage section 150 of the first storage node, and so on.

In a specific example, the mathematical function is:

$$Ydata(doff, n, m, i) := \frac{doff * m - i}{n}$$

$$Yparity(poff, n, m, i) := \frac{(poff + 1) * m - i - 1}{m - n}$$

where y is the coding line, off is the block offset, n is the number of data blocks, m is the number of data and parity blocks, and i is the information dispersal algorithm (IDA) offset.

Figure 34:
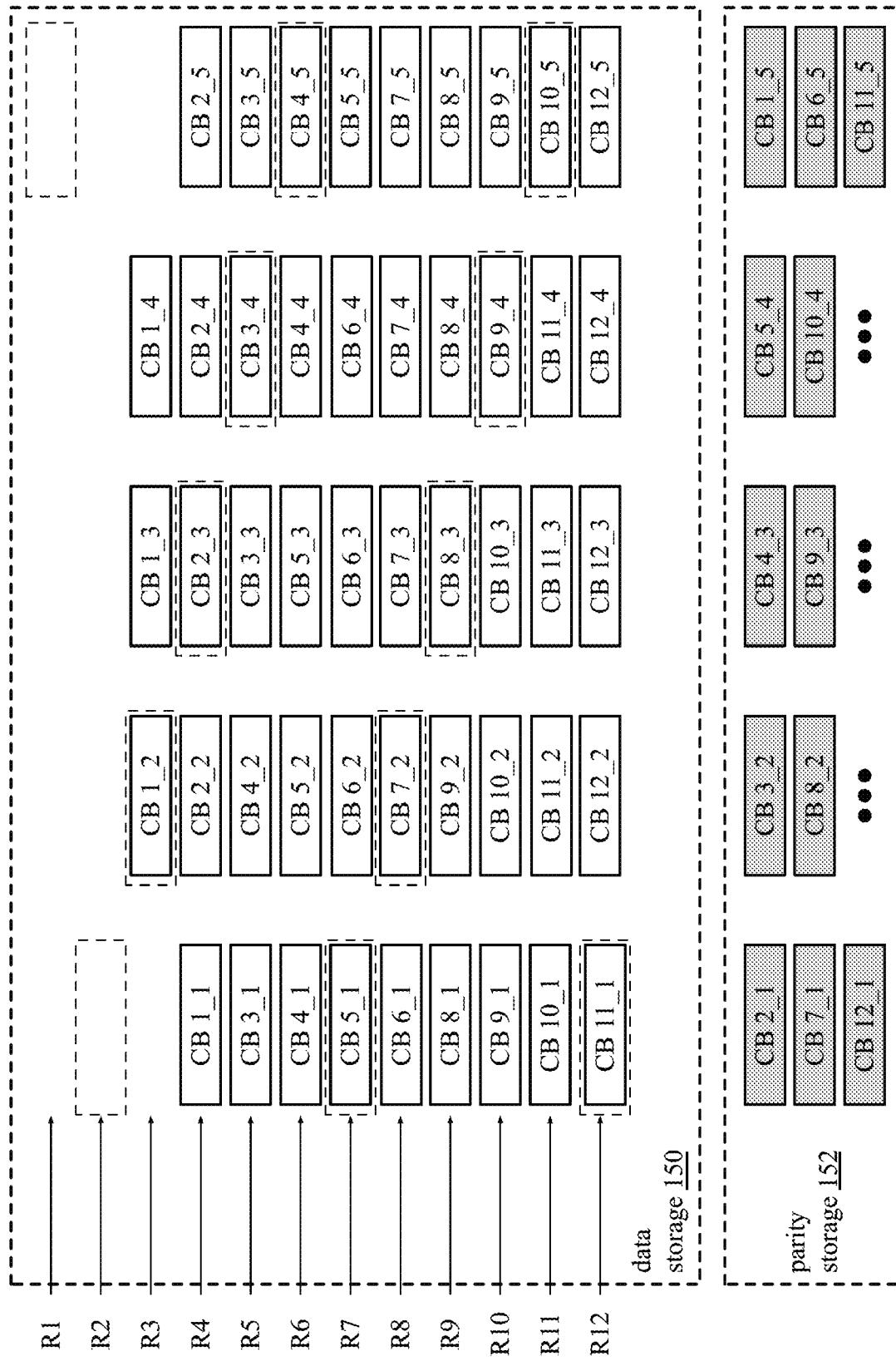
FIG. 34 is a schematic block diagram of another example of filling the empty spaces in the data storage section of FIG. 32 in accordance with the present invention.

FIG. 34 is a schematic block diagram of another example of filling the empty spaces in the data storage section 150 of FIG. 32. In this example, voids in the data storage section 150 are filled by applying a mathematical function that includes a logical address adjustment that effectively pushes down data blocks (e.g., coding blocks (CBs)) in the data storage section 150 to fill the voids. For example, to fill the voids in the data storage section 150 of a first storage node, CB 8_1 through CB 11_1 are effectively moved down to fill the void in R12 and CB 1_1, CB 3_1, CB 4_1, CB 5_1, and 6_1 are effectively moved down to fill the void in R7.

Figure 35:
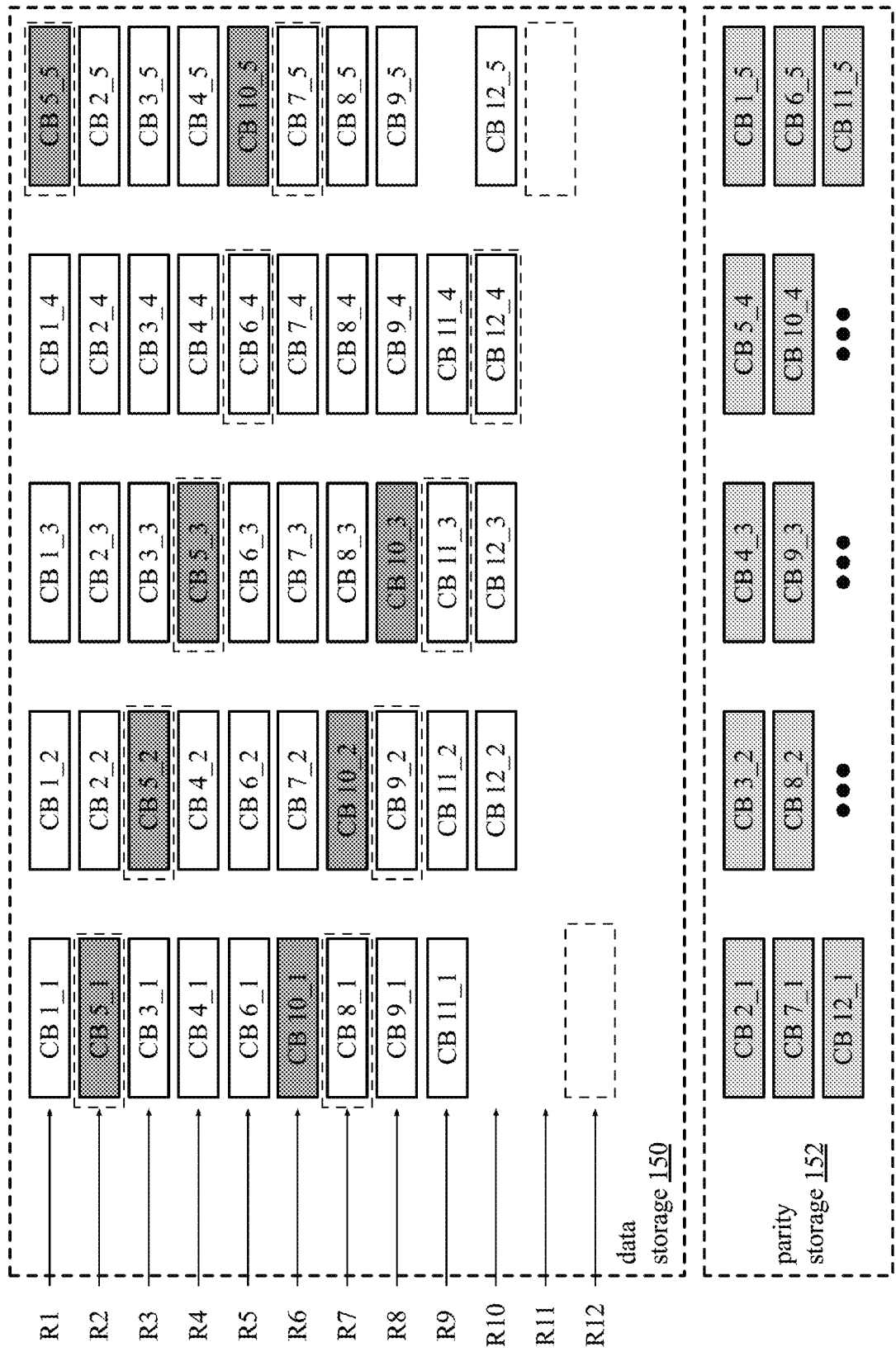
FIG. 35 is a schematic block diagram of another example of filling the empty spaces in the data storage section of FIG. 32 in accordance with the present invention.

FIG. 35 is a schematic block diagram of another example of filling the empty spaces in the data storage section 150 of FIG. 32. In this example, voids are filled by applying a mathematical function that includes using data blocks from every "n" lines of data blocks, and using data blocks of "n–d" lines of data blocks to fill voids in "n–k" lines of data blocks in the "n" lines of data blocks, where "n" equals the number of storage nodes (e.g., computing devices) in a cluster of storage nodes, "k" equals the number of parity blocks created per line of data blocks, and "d" equals the number of data blocks in the line of data blocks. For example, here "n" equals 5, "k" equals 1, and "d" equals 4. Therefore, blocks of "n–d" (5–4=1) line of every "n" (5) lines is used to fill "n–k" (5–1=4) lines. For example, the fifth line of coding blocks includes CB 5_1, CB 5_2, CB 5_3, and CB 5_5. CB 5_1 is used to fill the void between CB 1_1 and CB 3_1, CB 5_2 is used to fill the void between CB 2_2 and CB 4_2. CB 5_3 is used to fill the void above CB 2_5. A similar method occurs using data from the tenth line to fill voids between lines 6-9.

Figure 36:
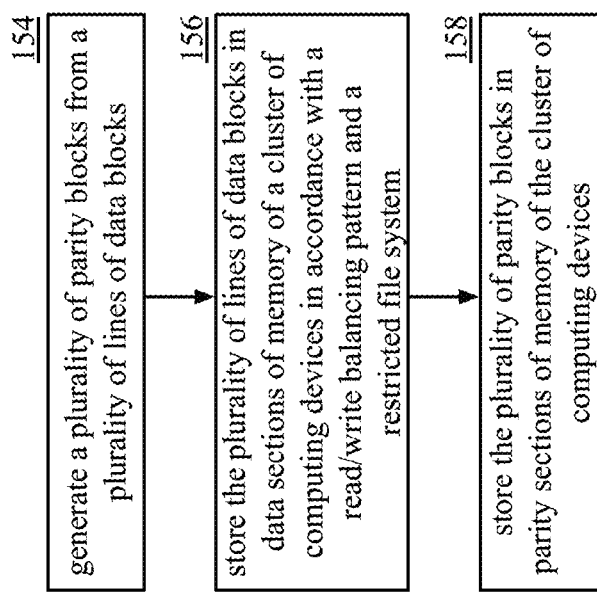
FIG. 36 is a logic diagram of an example of a method of storing data blocks in a data storage section and parity blocks in a parity storage section in accordance with the present invention.

FIG. 36 is a logic diagram of an example of a method of storing data blocks in a data storage section and parity blocks in a parity storage section. The method begins with step 154 where a processing entity of a computing system generates a plurality of parity blocks from a plurality of lines of data blocks where a first number of parity blocks of the plurality of parity blocks is generated from a first line of data blocks of the plurality of lines of data blocks. For example, using a 4 of 5 coding scheme, where five segments are each divided into a plurality of data blocks, four data blocks from four of the data segments are arranged into a line of data blocks to calculate a fifth block (i.e., a parity block).

The processing entity may be one or more processing core resources of a computing device of a cluster of computing devices of the computing system and/or one or more nodes of a computing device of the cluster of computing devices. The cluster of computing devices includes a number of computing devices that equals a number of data blocks in a line of data blocks of the plurality of lines of data blocks plus a number of parity blocks created from the line of data blocks. For example, five computing devices are needed in a cluster when a line of data blocks includes four data blocks plus one parity block.

The method continues with step 156 where the processing entity stores the plurality of lines of data blocks in data sections of memory of the cluster of computing devices of the computing system in accordance with a read/write balancing pattern and a restricted file system. The data sections of memory of the cluster of computing devices each include a plurality of segment group data sections for storing corresponding data segments of a plurality of segment groups.

The method continues with step 158 where the processing entity stores the plurality of parity blocks in parity sections of memory of the cluster of computing devices in accordance with the read/write balancing pattern and the restricted file system. The parity sections of memory of the cluster of computing devices includes a plurality of segment group parity sections for storing corresponding parity segments of a plurality of segment groups.

The restricted file system includes a logical address mapping for a table that includes a plurality of partitions. Each partition of the plurality of partitions includes a plurality of segment groups. Each segment group of the plurality of segment groups includes a cluster number of segments. Each segment of the cluster number of segments includes a corresponding plurality of data blocks. The logical address mapping stores the table in logical address space of the memory of the cluster of computing devices in order of the plurality of partitions, the plurality of segment groups, the cluster number of segments, and the corresponding plurality of data blocks.

Each computing device in the number of computing devices includes a unique data section for storing an individual data block of a line of data blocks of lines of data blocks of a segment of a segment group of a partition of a table. Each computing device in the number of computing devices also includes a unique parity section for storing one or more parity blocks corresponding to a cluster number of lines of data blocks of the segment of the segment group of the partition of the table.

The read/write balancing pattern includes distributing, from line of data blocks to line of data blocks of the segment, storage of the individual data blocks of the lines of data blocks among the unique data sections of the number of computing devices. Further, the read/write balancing pattern includes distributing, from line of data blocks to line of data blocks of the segment, storage of corresponding parity blocks of the corresponding plurality of lines of data blocks among the unique parity sections of the number of computing devices.

For example, referring to FIGS. 21 and 23, lines of data blocks include distributed positioning of parity blocks. The parity blocks generated in the example of FIG. 20 (shown as shaded blocks) are distributed in accordance with a corresponding segment for storage. For example, parity blocks CB 2_1 and CB 7_1 are arranged with coding blocks of a first segment for storage in a first storage node, parity coding block CB 3_2 is arranged with coding blocks of a second segment for storage in a second storage node, parity coding block CB 4_3 is arranged with coding blocks of a third segment for storage in a third storage node, parity coding block 5_4 is arranged with coding blocks of a fourth segment for storage in a fourth storage node, and parity coding blocks CB 1_5 and CB 6_5 are arranged with coding blocks of a fifth segment for storage in a fifth storage node. Parity blocks are stored in a parity storage section (as discussed in FIG. 22) separate from the data storage sections resulting in voids in the data storage section.

The read/write balancing pattern includes various methods for filling voids created in the data storage section. For example, the read/write balancing pattern includes applying a mathematical function to fill voids in the unique data sections that includes a logical address adjustment that effectively pushes up data blocks in the unique data sections to fill the voids. For example, referring to FIG. 24, the mathematical function effectively pushes up the data blocks in groups of four (e.g., the number of data blocks in a line of data blocks) to use a minimal amount of moves to fill voids.

As another example, the read/write balancing pattern includes applying a mathematical function to fill voids in the unique data sections that includes a logical address adjustment that effectively pushes down data blocks in the unique data sections to fill the voids. As another example, the read/write balancing pattern includes applying a mathematical function to fill voids in the unique data sections, where the mathematical function includes using data blocks from every "n" lines of data blocks, using data blocks of "n–d" lines of the n lines of data blocks to fill the voids in "n–k" lines of data blocks in the "n" lines of data blocks, wherein "n" equals the number of computing devices in the cluster of computing devices, "k" equals the number of parity blocks created per line of data blocks, and "d" equals the number of data blocks in the line of data blocks. For example, referring to FIG. 26, a fifth line of data blocks is used to fill the voids between a first through fourth line of data blocks.

FIG. 37 is a schematic block diagram of an example of direct memory access for a processing core resource 48 and/or for a network connection 41 as previously discussed. Within a computing device, the main memory 40 is logically partitioned into a database section (e.g., database memory space 51) and a computing device section (e.g., CD memory space 56 as previously discussed). In an embodiment, the main memory 40 is logically shared among the processing cores of the nodes of a computing device under the control of the database operating system. In another embodiment, the main memory 40 is further logically divided by the database operating system such that a processing core resource of a node of the computing device is allocated its own main memory.

The database memory space 51 is logically and dynamically divided into a database operating system (DB OS) 52 section, a DB disk section 53, a DB network 54 section, and a DB general 55 section. The database operating system determines the size of the disk section, the network section, and the general section based on memory requirements for various operations being performed by the processing core resources, the nodes, and/or the computing device. As such, as the processing changes within a computing device, the size of the disk section, the network section, and the general section will most likely vary based on memory requirements for the changing processing.

Within the computing device, data stored on the memory devices is done in accordance with a data block format (e.g., 4 K byte block size). As such, data written to and read from the memory devices via the disk section of the main memory is done so in 4 K byte portions (e.g., one or more 4 K byte blocks). Conversely, network messages use a different format and are typically of a different size (e.g., 1 M byte messages).

To facilitate lock free and efficient data transfers, the disk section of the main memory is formatted in accordance with the data formatting of the memory devices (e.g., 4 K byte data blocks) and the network section of the main memory is formatted in accordance with network messaging formats (e.g., 1 M byte messages). Thus, when the processing module 44 is processing disk access requests, it uses the DB disk section 53 of the main memory 40 in a format corresponding to the memory device 42. Similarly, when the processing module 44 is processing network communication requests, it uses the DB network 54 section of the main memory 40 in a format corresponding to network messaging format(s).

In this manner, accessing memory devices is a separate and independent function of processing network communication requests. As such, the memory interface module 43 can directly access the DB disk 53 section of the main memory 40 with little to no intervention of the processing module 44. Similarly, the network interface module 46 can directly access the DB network section 54 of the main memory 40 with little to no intervention of the processing module 44. This substantially reduces interrupts of the processing module 44 to process network communication requests and memory device access requests. This also allows for lock free operation of memory device access requests and network communication requests with increased parallel operation of such requests.

FIGS. 38-39 are schematic block diagrams of an example of processing received data and distributing the processed data (e.g., a table) for storage in the database system when a computing device 18 in a storage cluster 1 is unavailable. When this occurs, the host computing device 18 (e.g., L2 computing device of a storage cluster or L1 computing device) reorganizes a segment group or creates a different type of a segment group. In either case, the resulting segment group (assuming 5 segments in the group) has four segments that include data and a fifth segment that only includes parity data.

FIG. 39 illustrates the host computing device 18 sending, via local communications 26, the four data segments to the four active computing devices 18 in the cluster 35 and holds the parity segment for the unavailable computing device. When the unavailable computing device becomes available, the host computing device sends it the parity segment.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
generating, by a computing system, a plurality of parity blocks from a plurality of lines of data blocks;
storing, by the computing system, the plurality of lines of data blocks in data sections of memory of a cluster of computing devices of the computing system based on distributing storage of individual data blocks of the plurality of lines of data blocks among unique data sections of the cluster of computing devices; and
storing, by the computing system, the plurality of parity blocks in parity sections of memory of the cluster of computing devices based on distributing storage of parity blocks of the plurality of parity blocks among unique parity sections of the cluster of computing devices.

2. The method of claim 1, wherein storing the plurality of lines of data blocks and the plurality of parity blocks in the data sections and the parity sections, respectively, is further in accordance with a restricted file system that operates via:
a logical address mapping for a table that includes a plurality of partitions, wherein each partition of the plurality of partitions includes a plurality of segment groups, wherein each segment group of the plurality of segment groups includes a cluster number of segments, wherein each segment of the cluster number of segments includes a corresponding plurality of the individual data blocks, and wherein the logical address mapping stores the table in logical address space of the memory of the cluster of computing devices in order of the plurality of partitions, the plurality of segment groups, the cluster number of segments, and the corresponding plurality of the individual data blocks.

3. The method of claim 1, wherein the cluster of computing devices includes a number of computing devices that equals a number of the individual data blocks in a line of data blocks of the plurality of lines of data blocks plus a number of parity blocks created from the line of data blocks;
wherein each computing device in the number of computing devices includes a unique data section of the data sections for storing an individual data block of individual data blocks corresponding to a segment of a segment group in accordance with a partition of a table;
wherein each computing device in the number of computing devices includes a unique parity section of the parity sections for storing one or more parity blocks corresponding to a cluster number of lines of data blocks corresponding to the segment of the segment group in accordance with the partition of the table.

4. The method of claim 3, wherein storing the plurality of lines of data blocks and the plurality of parity blocks in the data sections and the parity sections, respectively, further includes applying, by the computing system, a mathematical function to fill voids in the unique data sections, wherein the mathematical function includes a logical address adjustment that effectively pushes up individual data blocks in the unique data sections to fill the voids, wherein a void of the voids corresponds to a parity position of a code line associated with a line of data blocks of the plurality of lines of data blocks.

5. The method of claim 3, wherein storing the plurality of lines of data blocks and the plurality of parity blocks in the data sections and the parity sections, respectively, further includes applying, by the computing system, a mathematical function to fill voids in the unique data sections, wherein the mathematical function includes a logical address adjustment that effectively pushes down individual data blocks in the unique data sections to fill the voids.

6. The method of claim 3, wherein storing the plurality of lines of data blocks and the plurality of parity blocks in the data sections and the parity sections, respectively, further includes applying, by the computing system, a mathematical function to fill voids in the unique data sections, wherein the mathematical function includes using individual data blocks from every "n" lines of data blocks, using data blocks of "n-d" lines of the n lines of data blocks to fill the voids in "n-k" lines of data blocks in the "n" lines of data blocks, wherein "n" equals the number of computing devices in the cluster of computing devices, "k" equals the number of parity blocks created per line of data blocks, and "d" equals the number of the individual data blocks in the line of data blocks.

7. The method of claim 1, wherein a first number of parity blocks of the plurality of parity blocks is generated from a first line of data blocks of the plurality of lines of data blocks, and a second number of parity blocks of the plurality of parity blocks is generated from a second line of data blocks of the plurality of lines of data blocks.

8. The method of claim 1, wherein the data sections of memory of the cluster of computing devices each comprises:
a plurality of segment group data sections for storing corresponding data segments of a plurality of segment groups.

9. The method of claim 1, wherein the parity sections of memory of the cluster of computing devices each comprises:
a plurality of segment group parity sections for storing corresponding parity segments of a plurality of segment groups.

10. The method of claim 1, wherein the cluster of computing devices comprises one or more of:
one or more processing core resources of a computing device;
one or more nodes of the computing device;
one or more processing core resources of another computing device; or
one or more nodes of the other computing device.

11. A computer readable memory comprises:
at least one memory section that stores operational instructions that, when executed by a computing system that includes a processor and a memory, causes the computing system to perform operations that include:
generating a plurality of parity blocks from a plurality of lines of data blocks;
storing the plurality of lines of data blocks in data sections of memory of a cluster of computing devices of the computing system based on distributing storage of individual data blocks of the plurality of lines of data blocks among unique data sections of the cluster of computing devices; and
storing the plurality of parity blocks in parity sections of memory of the cluster of computing devices based on distributing storage of parity blocks of the plurality of parity blocks among unique parity sections of the cluster of computing devices.

12. The computer readable memory of claim 11, wherein storing the plurality of lines of data blocks and the plurality of parity blocks in the data sections and the parity sections, respectively, is further in accordance with a restricted file system that operates via:
a logical address mapping for a table that includes a plurality of partitions, wherein each partition of the plurality of partitions includes a plurality of segment groups, wherein each segment group of the plurality of segment groups includes a cluster number of segments, wherein each segment of the cluster number of segments includes a corresponding plurality of data blocks, and wherein the logical address mapping stores the table in logical address space of the memory of the cluster of computing devices in order of the plurality of partitions, the plurality of segment groups, the cluster number of segments, and the corresponding plurality of data blocks.

13. The computer readable memory of claim 11, wherein the cluster of computing devices includes a number of computing devices that equals a number of the individual data blocks in a line of data blocks of the plurality of lines of data blocks plus a number of parity blocks created from the line of data blocks;
wherein each computing device in the number of computing devices includes a unique data section of the data sections for storing an individual data block of individual data blocks corresponding to a segment of a segment group in accordance with a partition of a table;
wherein each computing device in the number of computing devices includes a unique parity section of the parity sections for storing one or more parity blocks corresponding to a cluster number of lines of data blocks corresponding to the segment of the segment group in accordance with the partition of the table.

14. The computer readable memory of claim 13, wherein the operations further include:
applying a mathematical function to fill voids in the unique data sections, wherein the mathematical function includes a logical address adjustment that effectively pushes up individual data blocks in the unique data sections to fill the voids, wherein a void of the voids corresponds to a parity position of a code line associated with a line of data blocks of the plurality of lines of data blocks.

15. The computer readable memory of claim 13, wherein the operations further include:
applying a mathematical function to fill voids in the unique data sections, wherein the mathematical function includes a logical address adjustment that effectively pushes down individual data blocks in the unique data sections to fill the voids.

16. The computer readable memory of claim 13, wherein the operations further include:
applying a mathematical function to fill voids in the unique data sections, wherein the mathematical function includes using individual data blocks from every "n" lines of data blocks, using data blocks of "n-d" lines of the n lines of data blocks to fill the voids in "n-k" lines of data blocks in the "n" lines of data blocks, wherein "n" equals the number of computing devices in the cluster of computing devices, "k" equals the number of parity blocks created per line of data blocks, and "d" equals the number of the individual data blocks in the line of data blocks.

17. The computer readable memory of claim 11, wherein generating the plurality of parity blocks from a plurality of lines of data blocks includes applying a modulo pattern to select a position of each one of the plurality of parity blocks with respect to a corresponding one of the plurality of lines of data blocks, and wherein distributing storage of parity blocks of the plurality of parity blocks among unique parity sections of the cluster of computing devices is based on the position of each one of the plurality of parity blocks with respect to the corresponding one of the plurality of lines of data blocks.

18. The computer readable memory of claim 11, wherein the data sections of memory of the cluster of computing devices each comprises:
a plurality of segment group data sections for storing corresponding data segments of a plurality of segment groups.

19. The computer readable memory of claim 11, wherein the cluster of computing devices comprises one or more of:
one or more processing core resources of a computing device;
one or more nodes of the computing device;
one or more processing core resources of another computing device; or
one or more nodes of the other computing device.

20. A computing system comprising:
at least one processor; and
a memory that stores operational instructions that, when executed by the at least one processor, causes the computing system to perform operations that include:
  generating a plurality of parity blocks from a plurality of lines of data blocks;
  storing the plurality of lines of data blocks in data sections of memory of a cluster of computing devices of the computing system based on distributing storage of individual data blocks of the plurality of lines of data blocks among unique data sections of the cluster of computing devices; and
  storing the plurality of parity blocks in parity sections of memory of the cluster of computing devices based on distributing storage of parity blocks of the plurality of parity blocks among unique parity sections of the cluster of computing devices.

* * * * *